United States Patent
Kim et al.

(10) Patent No.: US 10,096,577 B2
(45) Date of Patent: Oct. 9, 2018

(54) SEMICONDUCTOR MEMORY PACKAGE INCLUDING STACKED LAYERS AND MEMORY DEVICE AND SEMICONDUCTOR MEMORY SYSTEM HAVING THE SAME

(71) Applicant: Samsung Electronics Co., Ltd., Suwon-si (KR)

(72) Inventors: Seok Kim, Hwaseong-si (KR); Chi-sung Oh, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/622,154

(22) Filed: Jun. 14, 2017

(65) Prior Publication Data

US 2018/0012867 A1 Jan. 11, 2018

(30) Foreign Application Priority Data

Jul. 8, 2016 (KR) .................... 10-2016-0087119

(51) Int. Cl.
*H01L 25/065* (2006.01)
*H01L 23/00* (2006.01)
*H05K 1/11* (2006.01)

(52) U.S. Cl.
CPC .......... *H01L 25/0657* (2013.01); *H01L 24/14* (2013.01); *H05K 1/115* (2013.01)

(58) Field of Classification Search
CPC ...... H01L 24/14; H01L 25/0657; H05K 1/115
See application file for complete search history.

(56) References Cited

U.S. PATENT DOCUMENTS

| | | |
|---|---|---|
| 7,910,922 B2 | 3/2011 | Nishimura et al. |
| 8,098,508 B2 | 1/2012 | Janzen |
| 8,796,863 B2 | 8/2014 | Lee et al. |
| 8,799,730 B2 | 8/2014 | Oh et al. |
| 8,873,267 B2 | 10/2014 | Lee |
| 8,953,394 B2 | 2/2015 | Jeon et al. |
| 9,058,855 B2 | 6/2015 | Stephens, Jr. |
| 9,685,422 B2 * | 6/2017 | Lee ..................... H01L 25/0652 |
| 9,761,564 B1 * | 9/2017 | Shibata ............... H01L 25/0657 |

(Continued)

OTHER PUBLICATIONS

Kim et al., "HBM: Memory Solution for Bandwidth-Hungry Processors." SK hynix Inc. Aug. 2014.

*Primary Examiner* — Tom Thomas
*Assistant Examiner* — Benjamin Tzu-Hung Liu
(74) *Attorney, Agent, or Firm* — Muir Patent Law, PLLC

(57) ABSTRACT

A semiconductor memory package includes a base layer that communicates with a memory controller; at least one memory layer that is stacked on the base layer; and at least one through silicon via that penetrates through the at least one memory layer, wherein at least one signal bump for exchanging a signal with the memory controller is disposed in a first area of the base layer located to be adjacent to the memory controller, and wherein the first area corresponds to an edge area of the base layer, and a power bump for receiving power from outside of the semiconductor memory package for performing a signal processing operation on the signal is disposed in a second area of the base layer contacting the at least one through silicon via, wherein the second area corresponds to an area other than edge areas of the base layer.

20 Claims, 21 Drawing Sheets

(56) References Cited

U.S. PATENT DOCUMENTS

| | | | |
|---|---|---|---|
| 9,851,401 B2* | 12/2017 | Kim | ................... G01R 31/3187 |
| 2015/0123268 A1 | 5/2015 | Yu et al. | |
| 2015/0214172 A1 | 7/2015 | Lin et al. | |

* cited by examiner

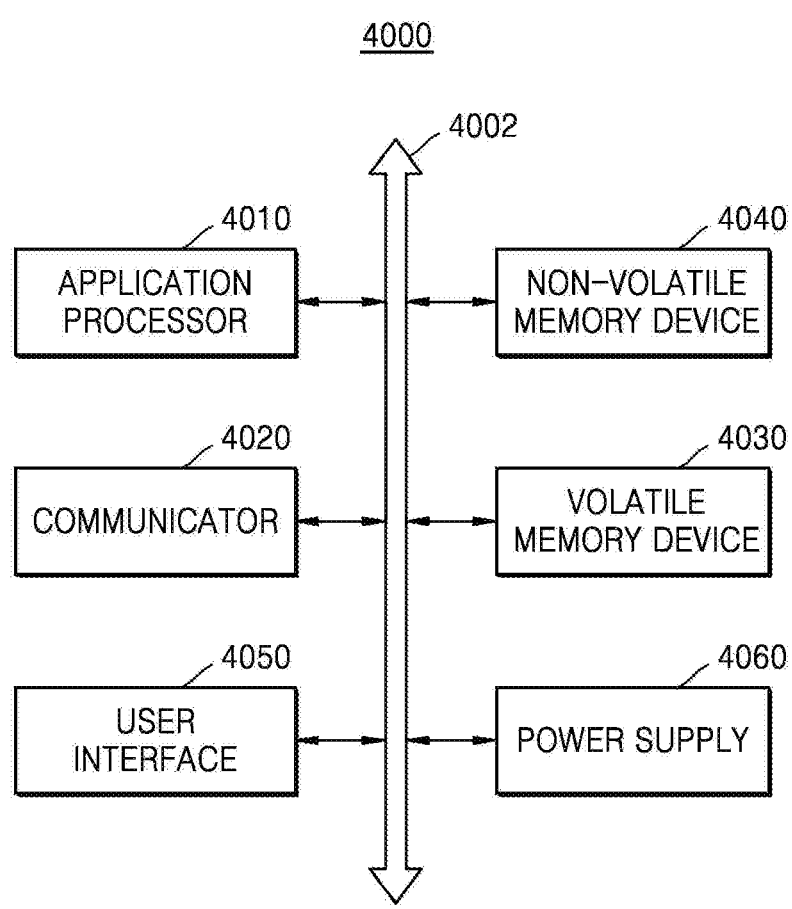

SEMICONDUCTOR MEMORY PACKAGE INCLUDING STACKED LAYERS AND MEMORY DEVICE AND SEMICONDUCTOR MEMORY SYSTEM HAVING THE SAME

CROSS-REFERENCE TO RELATED APPLICATION

This application claims the benefit of priority under 35 USC § 119 to Korean Patent Application No. 10-2016-0087119, filed on Jul. 8, 2016, in the Korean Intellectual Property Office, the disclosure of which is incorporated herein in its entirety by reference.

BACKGROUND

The present disclosure relates to a semiconductor memory package including stacked layers, and more particularly, to a semiconductor memory package including stacked layers having a bump arrangement for efficient operations including a communication operation.

Both the capacity and speed of a semiconductor memory, which may be used as a storage device in most recent electronic devices, are increasing. Furthermore, various attempts are being made for mounting a memory with a larger capacity within a smaller space and efficiently operating the memory.

Recently, in order to increase the integration of a semiconductor memory, a 3-dimensional (3D) structure including a plurality of stacked memory chips is being applied instead of a 2-dimensional (2D) structure. Based on demand for large integration and large capacity memories, a structure that employs a 3D stacked structure of the memory chips for increasing the capacity of a memory, increasing integration by reducing the size of a semiconductor chip, and reducing cost for manufacturing the same may be in demand.

SUMMARY

The present disclosure provides a semiconductor memory package and a semiconductor memory module including a structure having disposed therein bumps for efficiently communicating with a processor.

According to an aspect of the inventive concept, there is provided an electronic device including a base layer that communicates with a memory controller; at least one memory layer that is stacked on the base layer; and at least one through silicon via that penetrates through the at least one memory layer, wherein at least one signal bump for exchanging a signal with the memory controller is disposed in a first area of the base layer located to be adjacent to the memory controller, and wherein the first area corresponds to an edge area of the base layer, and at least one power bump for receiving power from outside of the semiconductor memory package, the power for performing a signal processing operation on the signal, wherein the power bump is disposed in a second area of the base layer and contacts the at least one through silicon via, wherein the second area corresponds to an area other than edge areas of the base layer, wherein all signal bumps are disposed only in the first area of the base layer located to be adjacent to the memory controller and all power bumps are disposed only in the second area of the base layer located to be further away from the memory controller compared to the signal bumps.

According to another aspect of the inventive concept, there is provided an electronic device including a base layer; at least one memory layer that is stacked on the base layer; and at least one through substrate via (TSV) that penetrates through the at least one memory layer, wherein the base layer includes a physical area adjacent to an external memory controller and a TSV area contacting the at least one TSV, the physical area includes a first input/output circuit that transmits a signal received from the external memory controller to the TSV area, the physical area corresponds to an edge area of the base layer and the TSV area corresponds to an area other than edge areas of the base layer, and the TSV area includes a second input/output circuit that performs a signal processing operation on to the received signal and transmits the processed signal to the memory layer, wherein one or more signal TSVs/bumps for receiving the signal from the external memory controller are disposed only in the physical area not in the TSV area, and one or more power TSVs/bumps for receiving power for performing the signal processing operation from outside of the memory device are disposed only in the TSV area not in the physical area.

According to another aspect of the inventive concept, there is provided a memory module including an interposer; a memory controller attached to a surface of the interposer; and one or more semiconductor memory packages each comprising: a base layer that communicates with the memory controller; at least one memory layer that is stacked on the base layer; and at least one through silicon via that penetrates through the at least one memory layer, wherein at least one signal bump for exchanging a signal other than power signal with the memory controller is disposed only in a first area of the base layer located to be adjacent to the memory controller, and wherein the first area corresponds to an edge area of the base layer, and at least one power bump for receiving a power signal from outside of the semiconductor memory package for performing a signal processing operation on the signal other than the power signal is disposed only in a second area of the base layer contacting the at least one through silicon via, wherein the second area corresponds to an area other than edge areas of the base layer, and wherein all signal bumps are disposed only in the first area of the base layer located to be adjacent to the memory controller and all power bumps are disposed only in the second area of the base layer located to be further away from the memory controller compared to the signal bumps.

BRIEF DESCRIPTION OF THE DRAWINGS

Embodiments of the inventive concept will be more clearly understood from the following detailed description taken in conjunction with the accompanying drawings in which:

FIG. 15 is a block diagram showing an example of applying a memory device according to an exemplary embodiment to a mobile system.

DETAILED DESCRIPTION OF THE EMBODIMENTS

Figure 1:
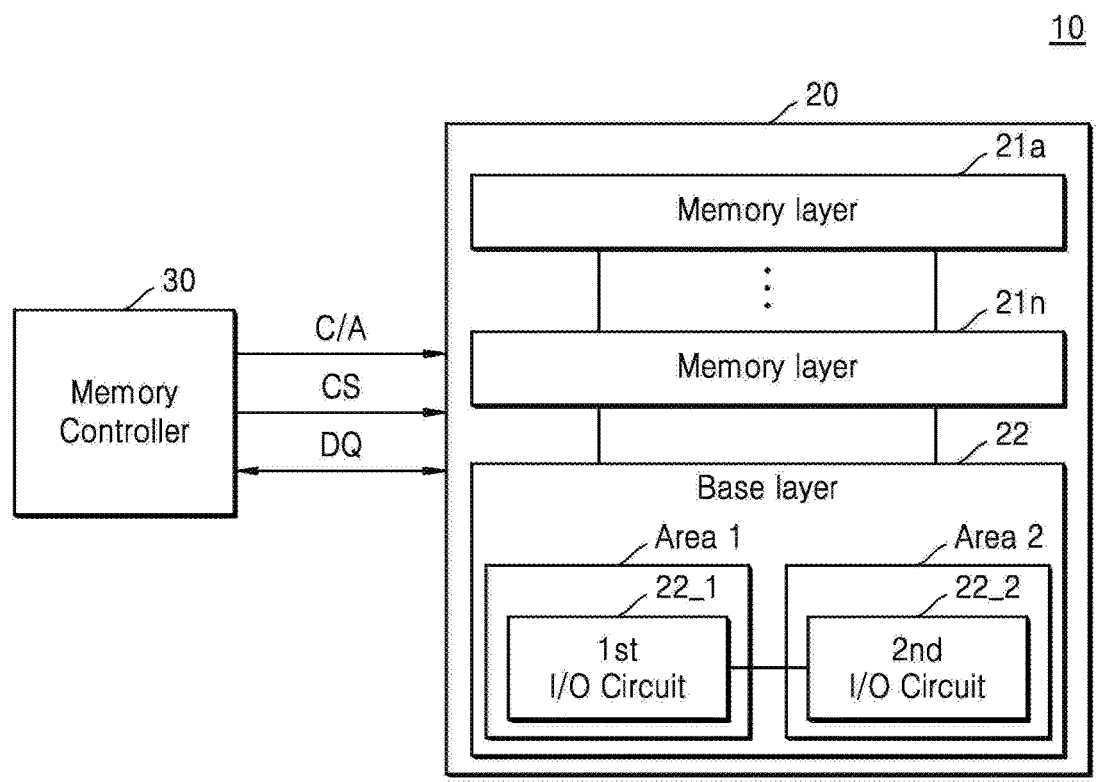
FIG. 1 is a diagram showing a semiconductor memory system according to an exemplary embodiment of the inventive concept.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

As used herein, and unless indicated otherwise, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) that does not permit electric current to pass therethrough is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a diagram showing a semiconductor memory system 10 according to an exemplary embodiment of the inventive concept.

Referring to FIG. 1, the semiconductor memory system 10 may include a semiconductor memory package 20 and a memory controller 30. The semiconductor memory package 20 may be a memory device, e.g., a semiconductor memory device, and, more specifically, may be a high bandwidth memory (HBM) device. Detailed description thereof will be given below.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

According to an exemplary embodiment, the semiconductor memory package 20 exchanges a data signal DQ with the memory controller 30, and the memory controller 30 may provide a command and address signal C/A and a chip selecting signal CS for controlling the semiconductor memory package 20. However, although FIG. 1 shows that the semiconductor memory package 20 communicates with the memory controller 30, the inventive concept is not limited thereto. The semiconductor memory package 20 may communicate with a processor, a central processing unit (CPU), and a graphics processing unit (GPU). For example, the memory controller 30 may be included in the processor, the CPU, or the GPU. Hereinafter, an exemplary embodiment in which the semiconductor memory package 20 communicates with the memory controller 30 will be described. The semiconductor memory package 20 may include a plurality of memory layers 21a through 21n and a base layer 22. Each of the memory layers 21a through 21n may include at least one memory core, where the at least one memory core may include a memory cell array for storing data, a row decoder, a column decoder, and a sense amp. The base layer 22 may perform an interface operation for providing a data signal DQ, a command and address signal C/A, and a chip selecting signal CS received from the memory controller 30 to the memory layers 21a through 21n or for providing data signals DQ received from the memory layers 21a through 21n to the memory controller 30.

In some exemplary embodiments, the memory package 20 and/or the memory controller 30 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

According to an exemplary embodiment, the semiconductor memory package 20 may be fabricated by stacking the plurality of memory layers 21a through 21n and the base layer 22 and packaging the same. Meanwhile, the plurality of memory layers 21a through 21n stacked on the base layer 22 are electrically connected to the base layer 22. The semiconductor memory package 20 may include conductive units for interconnecting the layers with one another. According to an exemplary embodiment, the semiconductor memory package 20 may include through substrate vias (TSVs), such as through silicon vias as the conductive units. In order to use the TSVs as conductive units between layers, one or more layers in the semiconductor memory package 20 may include at least one via that penetrates the layers in a vertical direction.

The base layer 22 disposed at the bottom may include a first area Area1 and a second area Area2. A distance from the first area Area1 to the memory controller 30 in a first direction may be smaller than a distance from the second area Area2 to the memory controller 30 in the first direction. Thus, the first area Area1 may be disposed closer to (e.g., adjacent to) the memory controller 30 compared to the second area Area2. The second area Area2 contacts TSVs penetrating through the memory layers 21a through 21n. According to an exemplary embodiment, in order to interface various signals exchanged between the semiconductor memory package 20 and an external device, the first area Area1 may include a first input/output circuit 22_1 and the second area Area2 may include a second input/output circuit 22_2. According to an exemplary embodiment, the base layer 22 may include an interface circuit consisting of the first input/output circuit 22_1 and the second input/output circuit 22_2. An input/output circuit may be defined as an arrangement of conductive devices that function as paths for various signals. Furthermore, an input/output circuit may also include conductive pads or conductive lines only.

Each of the memory layers 21a through 21n may include a control logic that interfaces with the base layer 22 in order to perform read/write operations on a memory layer. According to an exemplary embodiment, control logics of the respective memory layers 21a through 21n are electrically connected to the base layer 22, and thus the base layer 22 and the memory layers 21a through 21n may exchange various control signals and data signals.

The first input/output circuit 22_1 according to an exemplary embodiment may receive a data signal DQ, a command and address signal C/A, and a chip selecting signal CS from the memory controller 30 and transmit the data signal DQ, the command and address signal C/A, and the chip selecting signal CS to the second input/output circuit 22_2. Furthermore, the first input/output circuit 22_1 may receive a data signal DQ from the second input/output circuit 22_2 and transmit the data signal DQ to the memory controller 30. A plurality of bumps may be disposed in the first area Area1 of the base layer 22 including the first input/output circuit 22_1, and the bumps disposed in the first area Area1 may be electrically connected to the memory controller 30 via a plurality of external conductive lines for exchanging a signal (e.g., data signal or data transfer signal) with the memory controller 30. Thus, the bumps disposed in the first area Area1 may also be referred to as data transfer bumps or signal bumps.

The second input/output circuit 22_2 according to an exemplary embodiment may be electrically connected to the plurality of memory layers 21a through 21n. For example, when the semiconductor memory package 20 includes TSVs for connecting the memory layers 21a through 21n to one another, the second input/output circuit 22_2 may be electrically connected to the TSVs. The second input/output circuit 22_2 may include a buffer circuit for compensating signal integrity of data signal DQ, the command and address signal C/A, and the chip selecting signal CS received from the first input/output circuit 22_1. For example, the second input/output circuit 22_2 may compensate signal integrity of the data signal DQ, the command and address signal C/A, and the chip selecting signal CS and transmit the compensated data signal DQ, the command and address signal C/A, and the chip selecting signal CS to the memory layers 21a through 21n. Furthermore, the second input/output circuit 22_2 may include a buffer circuit (shown in FIG. 4A) for compensating signal integrity of a data signal DQ received from the memory layers 21a through 21n and may transmit a signal integrity-compensated data signal DQ to the first input/output circuit 22_1.

A plurality of bumps may be disposed in the second area Area2 of the base layer 22 including the second input/output circuit 22_2. The bumps disposed in the second area Area2 may receive power from outside of the memory package 20 for performing a predetermined signal processing operation (e.g., read/write operations). For example, they may be connected to receive a power signal, such as a constant voltage from a power source. Thus, the bumps disposed in the second area Area2 may also be referred to as power bumps. The power may be power necessary for the memory layers 21a through 21n to perform read/write operations in response to a command received from the memory controller 30 or power necessary for the base layer 22 to perform a certain interface operation. The second input/output circuit 22_2 may transmit power received from the power bumps to the memory layers 21a through 21n. Furthermore, the second input/output circuit 22_2 may include a plurality of conductive lines for transmitting power to a buffer circuit in the second input/output circuit 22_2.

According to an exemplary embodiment, the first input/output circuit 22_1 may be disposed closer to the memory controller 30 than the second input/output circuit 22_2. Furthermore, the signal bumps disposed in the first area Area1 may be disposed closer to the memory controller 30 than the power bumps disposed in the second area Area2. In some embodiments, all signal bumps may be disposed only in the first area Area1 of the base layer 22 located to be adjacent to the memory controller 30 and all power bumps may be disposed only in the second area Area2 of the base layer 22 located to be further away from the memory controller 30 compared to the signal bumps.

Bumps may be disposed in respective areas of the base layer 22 of the semiconductor memory package 20 corresponding to purposes. For example, signal bumps for receiving signals from the memory controller 30 and power bumps for receiving power may be disposed in different areas of the base layer 22. Here, by disposing signal bumps in an area closer to the memory controller 30 compared to the power bumps, signal integrity loss due to an external conductive line may be significantly reduced.

Figure 2:
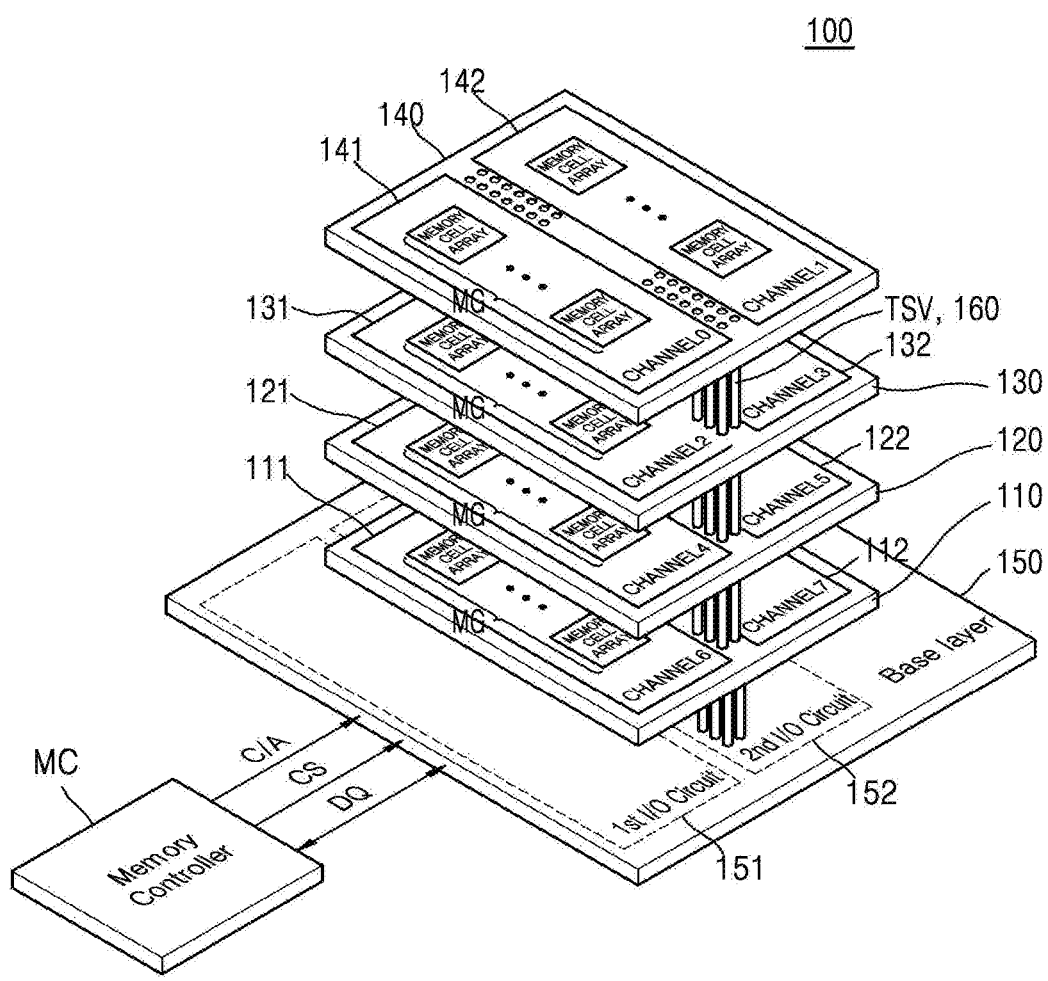
FIG. 2 is a diagram for describing a semiconductor memory system having stacked therein memory layers, according to an exemplary embodiment.

FIG. 2 is a diagram for describing a semiconductor memory package 100 having stacked therein memory layers, according to an exemplary embodiment.

Referring to FIG. 2, the semiconductor memory package 100 may include a plurality of stacked memory layers 110 through 140 and a base layer 150. Each of the memory layers 110 through 140 may include a plurality of independent interfaces. For example, the memory layers 110 through 140 may include two channels 111 and 112, 121 and 122, 131 and 132, and 141 and 142 as independent interfaces, respectively. Each of the channels 111 and 112, 121 and 122, 131 and 132, and 141 and 142 includes memory banks, that is, independent memory cell arrays and may be independently clocked. Each of the memory cell arrays shown in FIG. 2 may be defined as a single memory bank.

According to the present embodiment, the semiconductor memory package 100 may include a stack of the four memory layers 110 through 140 and have eight channels. However, the inventive concept is not limited thereto. According to exemplary embodiments, the semiconductor memory package 100 may include a stack of two to eight memory layers, where each of the memory layers may include one or four channels.

The base layer 150 may include a first input/output circuit 151 and a second input/output circuit 152. As shown in FIG. 2, the first input/output circuit 151 may be disposed closer to a memory controller MC than the second input/output circuit 152. Furthermore, as described above, the first input/output circuit 151 may be included in a first area of the base layer 150, whereas the second input/output circuit 152 may be included in a second area of the base layer 150. The first input/output circuit 151 may transmit data signal DQ, the command and address signal C/A, and the chip selecting signal CS received from the memory controller MC to the second input/output circuit 152. Furthermore, the first input/output circuit 151 may transmit data signals received from the second input/output circuit 152 to the memory controller MC.

The second input/output circuit 152 may provide a signal distributing function for transmitting data signal DQ, the command and address signal C/A, and the chip selecting signal CS received from the first input/output circuit 151 to the memory layers 110 through 140. Furthermore, the second input/output circuit 152 may transmit data signals DQ received from the memory layers 110 through 140 to the memory controller MC. The second input/output circuit 152 further includes a buffer circuit (shown in FIG. 4A). Therefore, the second input/output circuit 152 may buffer data signal DQ, the command and address signal C/A, and the chip selecting signal CS received from the first input/output circuit 151 and data signals DQ received from the memory layers 110 through 140 and compensate signal integrity of the data signal DQ, the command and address signal C/A, and the chip selecting signal CS.

The second input/output circuit 152 and the memory layers 110 through 140 may exchange signals via TSVs 160. The second input/output circuit 152 may be disposed in an area where the TSVs 160 electrically connecting the memory layers 110 through 140 to one another are electrically connected to the base layer 150. The base layer 150 may communicate with the external memory controller MC via a conductive member (e.g., a conductive line) disposed on an outer surface of the semiconductor memory package 100.

Figure 3A:
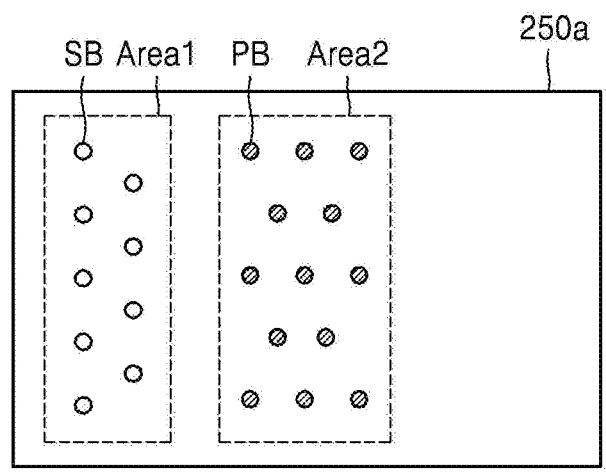
FIGS. 3A and 3B are diagrams for describing bumps disposed on surfaces of base layers according to an exemplary embodiment.
Figure 3B:
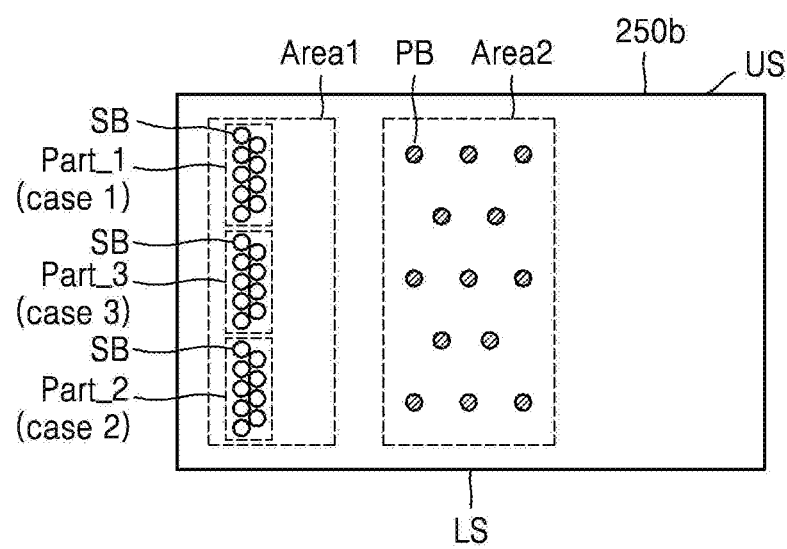
Figure 3C:
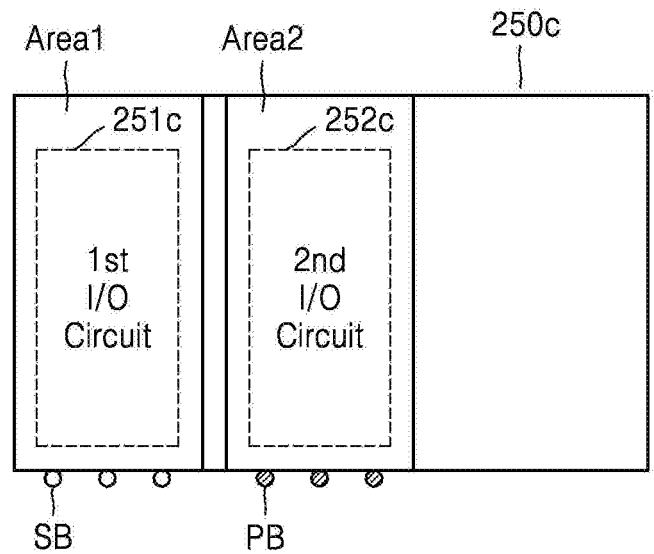
FIGS. 3C and 3D are diagrams for describing input/output circuits electrically connected to the bumps.
Figure 3D:
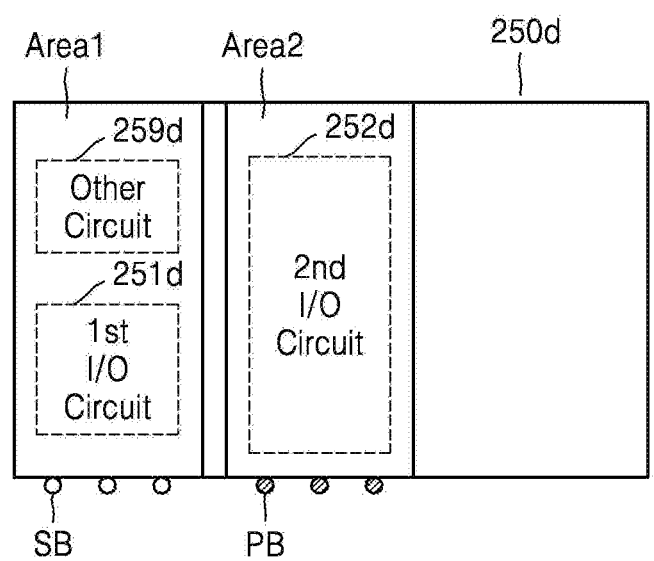

FIGS. 3A and 3B are diagrams for describing bumps disposed on surfaces of base layers 250a and 250b according to exemplary embodiments, and FIGS. 3C and 3D are diagrams for describing input/output circuits electrically connected to the bumps.

Referring to FIG. 3A, the base layer 250a may include a first area Area1 having disposed therein signal bumps SB for exchanging signals with an external processor or an external memory controller and a second area Area2 having disposed therein power bumps PB for receiving power from an external power supply or a power management integrated circuit (PMIC). The first area Area1 may be closer to a memory controller than the second area Area2, where the first area Area1 may correspond to an edge area of the base layer 250a. The number of signal bumps SB disposed in the first area Area1 may vary according to the number of external conductive lines for electrically connecting the memory controller to the base layer 250a. The second area Area2 may contact TSVs disposed on a plurality of memory layers.

Referring to FIG. 3B, according to this embodiment, the signal bumps SB may be densely disposed in the first area Area1 of the base layer 250b compared to the signal bumps SB that are disposed in the first area Area1 according to the embodiment of FIG. 3A. These signal bumps SB in FIG. 3B may be more densely arranged in the first area Area1 than the power bumps PB arranged in the second area Area2. Furthermore, the signal bumps SB may be disposed in a particular portion of the first area Area1 according to a location of the memory controller. For example, in a first case Case1, the signal bumps SB may be disposed in a first portion Part_1 closer to the upper side US of the base layer 250b at a higher density compared to FIG. 3A. In a second case Case2, the signal bumps SB may be disposed in a second portion Part_2 closer to the lower side LS of the base layer 250b at a higher density compared to FIG. 3A. Furthermore, in a third case Case3, the signal bumps SB may be disposed in a third portion Part_3, which corresponds to a portion of the base layer 250b between the upper side US and the lower side LS, at a higher density compared to FIG. 3A.

Referring to FIG. 3C, a base layer 250c may include a first area Area1 and a second area Area2. A distance from the first area Area1 to a memory controller may be smaller than a distance from the second area Area2 to the memory controller. For example, the first area Area1 may be disposed closer to a memory controller compared to the second area Area2. The second area Area2 may contact TSVs disposed at memory layers. The first area Area1 may include a first input/output circuit 251c and the second area Area2 may include a second input/output circuit 252c. The first input/output circuit 251c may be disposed closer to signal bumps SB and electrically connected thereto, whereas the second input/output circuit 252c may be disposed closer to power bumps PB and electrically connected thereto.

According to an exemplary embodiment, the first input/output circuit 251c may transmit and receive signals via the signal bumps SB. For example, the first input/output circuit 251c may transmit signals received from the memory controller to the second input/output circuit 252c or transmit signals received from the second input/output circuit 252c to the memory controller. The second input/output circuit 252c may receive power via the power bumps PB. Furthermore, the second input/output circuit 252c may electrically connect signals received from the first input/output circuit 251c and power received from outside to the TSVs, which are signal transmission targets, via signal routing. Furthermore, the second input/output circuit 252c may include a buffer circuit (shown in FIG. 4A), thereby compensating signal integrity of signals received from the first input/output circuit 251c or signals received from memory layers.

Referring to FIG. 3D, unlike the base layer 250c of FIG. 3C, a base layer 250d may further include a circuit 259d that is different from a first input/output circuit 251d in a portion of a first area Area1 other than a portion of the first area Area1 having disposed therein the first input/output circuit 251d. A conductive line of the first input/output circuit 251d may be disposed in a redistribution layer operation. For example, an area for disposing circuits for performing various operations other than the first input/output circuit 251d may be secured in the first area Area1. According to an exemplary embodiment, the circuit 259d may be a test circuit that performs testing operations on a plurality of memory layers stacked on the base layer 250d. According to another embodiment, the first area Area1 may include a memory cell array with respect to which the circuit 259d may perform a write operation or a read operation on the memory cell array.

FIGS. 4A through 4D are diagrams for describing semiconductor memory packages 300a, 300b, and 300c according to exemplary embodiments.

Figure 4A:
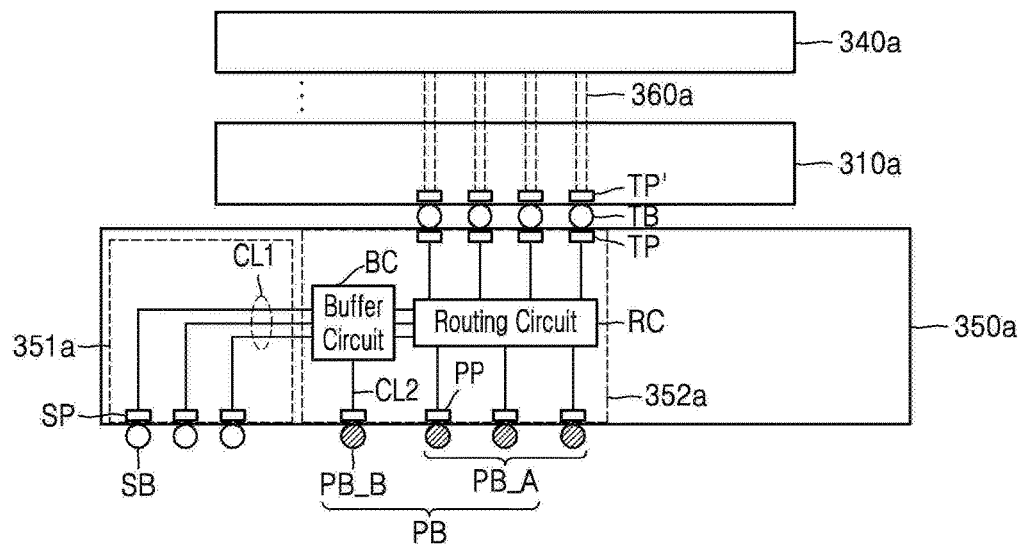
FIGS. 4A through 4D are diagrams for describing semiconductor memory packages according to exemplary embodiments.

Referring to FIG. 4A, the semiconductor memory package 300a may include a plurality of memory layers 310a through 340a, a base layer 350a, TSVs 360a, and a plurality of bumps SB, PB, and TB. The base layer 350a may include a first input/output circuit 351a and a second input/output circuit 352a for interfacing with memory controllers and/or the memory layers 310a through 340a. Furthermore, the plurality of memory layers 310a through 340a may be stacked on the base layer 350a, where the base layer 350a may be connected to the memory layers 310a through 340a via the TSVs 360a. A plurality of signal bumps SB may be disposed in a first area of the base layer 350a, whereas a plurality of power bumps PB may be disposed in a second area of the base layer 350a. The signal bumps SB may be electrically connected to a memory controller via a certain conductive unit, such that the memory controller and the semiconductor memory package 300a may communicate with each other. The power bumps PB may be electrically connected to a power supply or a PMIC via a certain conductive unit, such that the memory layers 310a through 340a and the base layer 350a included in the semiconductor memory package 300a may receive necessary power for performing a certain operation.

The first input/output circuit 351a may include a plurality of signal pads SP and a plurality of first conductive lines CL1. According to an exemplary embodiment, the first conductive lines CL1 may be disposed in a redistribution layer operation. The signal pads SP may be conductive units that directly contact the signal bumps SB and are electrically connected thereto. Furthermore, the signal pads SP may refer to some line areas of the first conductive lines CL1 that contact the signal bumps SB. The first conductive lines CL1 may be conductive units that transmit signals received by the signal pads SP to the second input/output circuit 352a or transmits signals received from the second input/output circuit 352a to the signal bumps SB. For example, the first input/output circuit 351a may transmit signals received from a memory controller to the second input/output circuit 352a via the first conductive lines CL1 without performing a certain signal processing operation or transmit signals received from the second input/output circuit 352a to the signal bumps SB via the first conductive lines CL1 without performing a certain signal processing operation. The second input/output circuit 352a may include certain conductive lines, a plurality of power pads PP, a buffer circuit BC, and a routing circuit RC. The routing circuit RC may only include a plurality of conductive lines for routing received signals. However, it is merely an example, and the inventive concept is not limited thereto. The power pads PP may be conductive units that directly contact the power bumps PB and are electrically connected thereto. Furthermore, the power pads PP may refer to some line areas of the first conductive lines CL1 that contact the power bumps PB.

According to an exemplary embodiment, the buffer circuit BC may compensate signal integrity of signals received from the first input/output circuit 351$a$ and/or signal integrity of signals received from the memory layers 310$a$ through 340$a$. For example, the buffer circuit BC may be electrically connected to the first conductive lines CL1 of the first input/output circuit 351$b$ and may compensate signal integrity of signals received via the first conductive lines CL1. The buffer circuit BC may transmit the signal integrity-compensated signals to the routing circuit RC. Furthermore, the buffer circuit BC may receive signals that are received from the memory layers 310$a$ through 340$a$ and routed by the routing circuit RC and compensate signal integrity of the signals. The buffer circuit BC may transmit the signal integrity-compensated signals to the first input/output circuit 351$b$. Furthermore, the buffer circuit BC may receive power via a power pad PP and a second conductive line CL2 that are electrically connected to a certain power bump PB_B. The buffer circuit BC may perform a buffering operation by using the power. However, although FIG. 4A shows a configuration that the buffer circuit BC directly receives power from the power bump PB_B via the second conductive line CL2, the inventive concept is not limited thereto, and various other circuit configurations may be employed. For example, the buffer circuit BC may receive power via the routing circuit RC.

The routing circuit RC may perform a routing operation for transmitting signals received from a memory controller and power received from outside to the memory layers 310$a$ through 340$a$, which are signal transmission targets, via the TSVs 360$a$. Furthermore, the routing circuit RC may perform a routing operation for transmitting signals received from the memory layers 310$a$ through 340$a$ to the memory controller via the signal bumps SB. Furthermore, the routing circuit RC may perform a routing operation for transmitting power received via the power bumps PB_B to the memory layers 310$a$ through 340$a$ via power TSVs.

The memory layers 310$a$ through 340$a$ may include TSV pads TP' that are electrically connected to the TSVs 360$a$ and may receive power from the base layer 350$a$ and exchange a plurality of signals with the base layer 350$a$ by using the TSV 360$a$ and the TSV pads TP'.

In the base layer 350$a$, according to the present embodiment, the second input/output circuit 352$a$ includes components including a buffer circuit that needs power for performing a certain signal processing operation, whereas the first input/output circuit 351$a$ includes components that do not perform a certain signal processing operation and only transmit signals. As a result, bumps may be disposed according to desired purposes. Therefore, compared to the power bumps PB, by disposing signal bumps SB in an area of the base layer 350$a$ closer to a processor, such as a memory controller, the length of an external conductive line that interconnects the base layer 350$a$ and the processor may be reduced, and thus loss of signal integrity may be minimized.

Figure 4B:
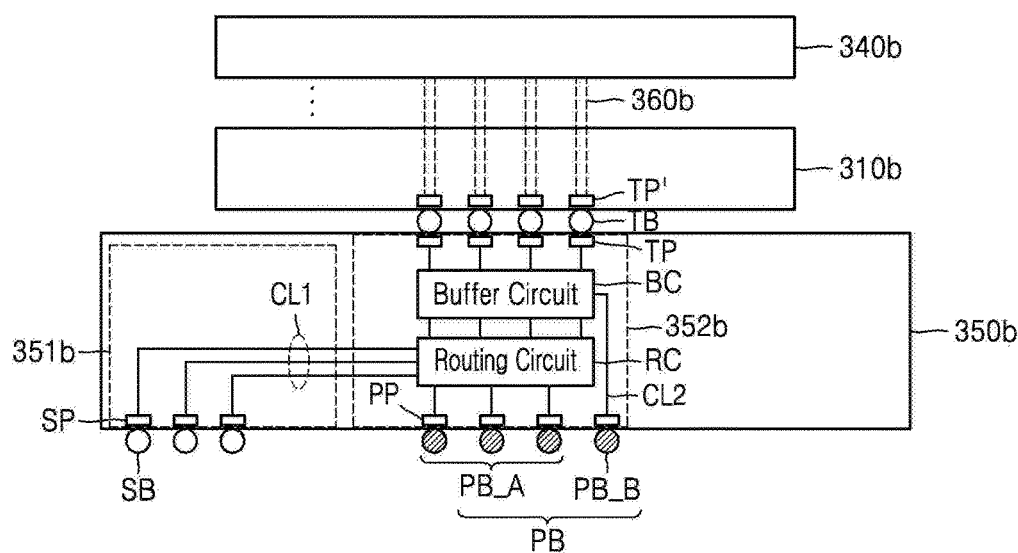

Referring to FIG. 4B, the semiconductor memory package 300$b$ according to another embodiment may include a plurality of memory layers 310$b$ through 340$b$, a base layer 350$b$, a TSV 360$b$, and a plurality of bumps SB, PB, and TB. The circuit configurations of the buffer circuit BC and the routing circuit RC of the base layer 350$b$ may be different than the base layer 350$a$ shown in FIG. 4A. According to an exemplary embodiment, the routing circuit RC may be electrically connected to a first input/output circuit 351$b$ via the first conductive lines CL1. The buffer circuit BC may be electrically connected to TSV pads TP, which contact TSV bumps TB and are electrically connected thereto, via certain conductive lines.

According to an exemplary embodiment, the routing circuit RC may perform a routing operation for receiving signals from the first input/output circuit 351$b$ and transmitting the signals to the memory layers 310$b$ through 340$b$, which are signal transmission targets, via the TSV 360$b$. The buffer circuit BC may compensate signal integrity of routed signals received from the routing circuit RC and may transmit the signal integrity-compensated signals to the memory layers 310$b$ through 340$b$ via the TSV 360$b$. Furthermore, the buffer circuit BC may compensate signal integrity of signals received from the memory layers 310$b$ through 340$b$ and may transmit the signal integrity-compensated signals to the routing circuit RC. The routing circuit RC may perform a routing operation for suitably transmitting the signal integrity-compensated signals to a memory controller and provide routed signals to the first input/output circuit 351$b$.

Figure 4C:
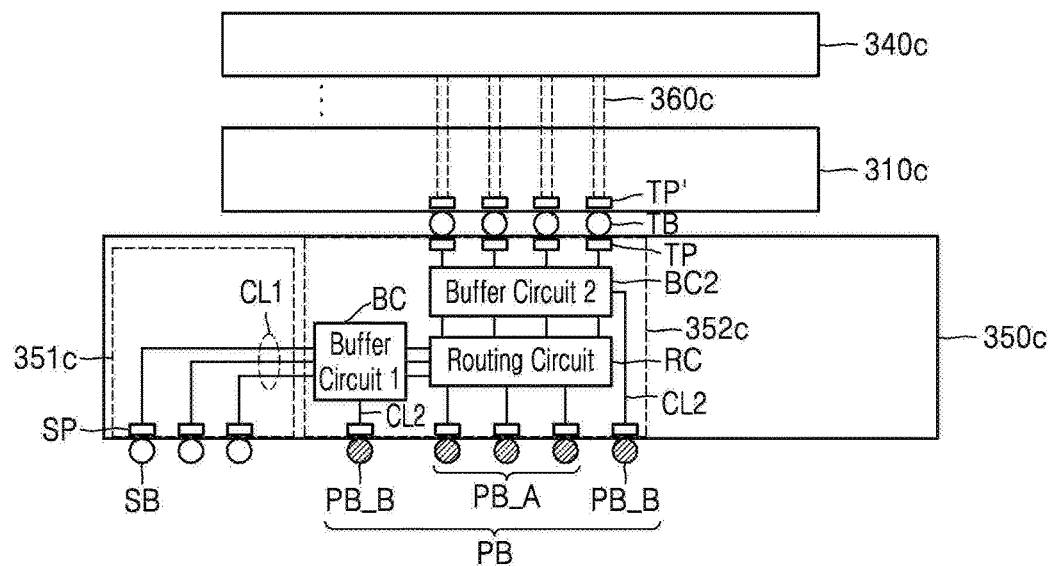

Referring to FIG. 4C, according to another embodiment, the semiconductor memory package 300$c$ may include a plurality of memory layers 310$c$ through 340$c$, a base layer 350$c$, a TSV 360$c$, and a plurality of bumps SB, PB, and TB. The base layer 350$c$ may include a first buffer circuit BC1 and a second buffer circuit BC2. For example, unlike the semiconductor memory packages 300$a$ and 300$b$ of FIGS. 4A and 4B, two signal integrity compensating operations may be performed by the first and second buffer circuits BC1 and BC2. According to an exemplary embodiment, first, the first buffer circuit BC1 may compensate signal integrity of signals received from the first input/output circuit 351$c$ and transmit the signals to the routing circuit RC. Next, the second buffer circuit BC2 may compensate signal integrity of the routed signals before the routed signals are transmitted to the memory layers 310$c$ through 340$c$ via the TSV 360$c$. Furthermore, the first and second buffer circuits BC1 and BC2 may receive power via power bumps PB_B and perform an operation for compensating signal integrity. Although the first and second buffer circuits BC1 and BC2 are shown in FIG. 4C as separate circuit configurations, the inventive concept is not limited thereto, and the first and second buffer circuits BC1 and BC2 may be embodied as a single circuit configuration.

Figure 4D:
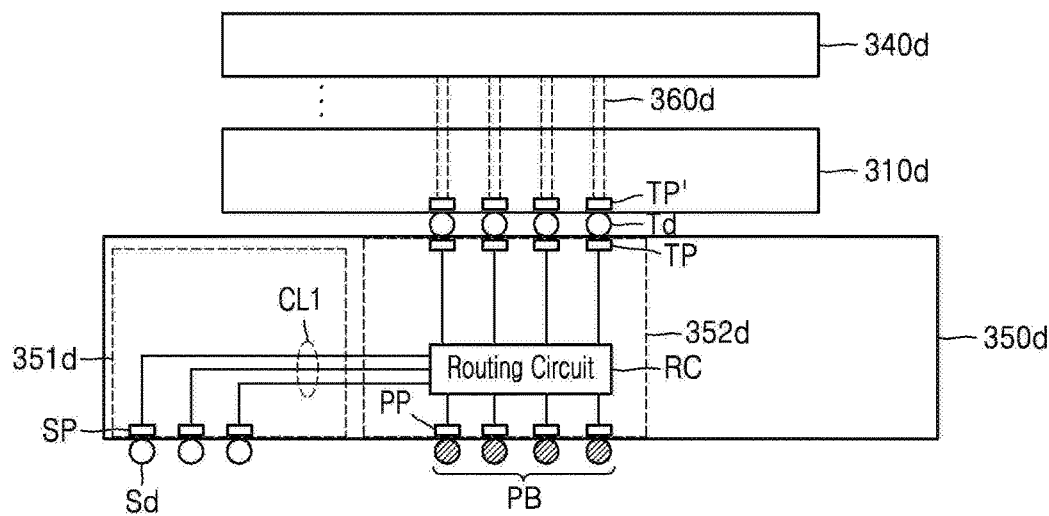

Referring to FIG. 4D, according to another embodiment, the semiconductor memory package 300$d$ may include a plurality of memory layers 310$d$ through 340$d$, a base layer 350$d$, a TSV 360$d$, and a plurality of bumps SB, PB, and TB. Unlike the base layer 350$b$ shown in FIG. 4B, the base layer 350$d$ may not include a buffer circuit BC. According to an exemplary embodiment, the routing circuit RC may be electrically connected to a first input/output circuit 351$d$ via the first conductive lines CL1. The routing circuit RC may be electrically connected to TSV pads TP, which contact the TSV bumps TB and are electrically connected thereto, via certain conductive lines.

According to an exemplary embodiment, the routing circuit RC may receive signals from the first input/output circuit 351$d$ and perform a routing operation for transmitting the signals to the memory layers 310$d$ through 340$d$, which are signal transmission targets, via the TSV 360$d$. Signal integrity of routed signals received from the routing circuit RC may be compensated by buffer circuits included in the respective memory layers 310d through 340d. Furthermore, the routing circuit RC may perform a routing operation for appropriately transmitting signals received from the memory layers 310d through 340d to a memory controller and provide routed signals to the first input/output circuit 351d.

Referring to FIG. 4D, according to another embodiment, the semiconductor memory package 300d may include the memory layers 310d through 340d, the base layer 350d, the TSV 360d, and a plurality of bumps SB, PB, and TB. Unlike the base layer 350b shown in FIG. 4B, the base layer 350d may not include a buffer circuit BC. According to an exemplary embodiment, the routing circuit RC may be electrically connected to a first input/output circuit 351d via the first conductive lines CL1. The routing circuit RC may be electrically connected to TSV pads TP, which contact the TSV bumps TB and are electrically connected thereto, via certain conductive lines.

Figure 5:
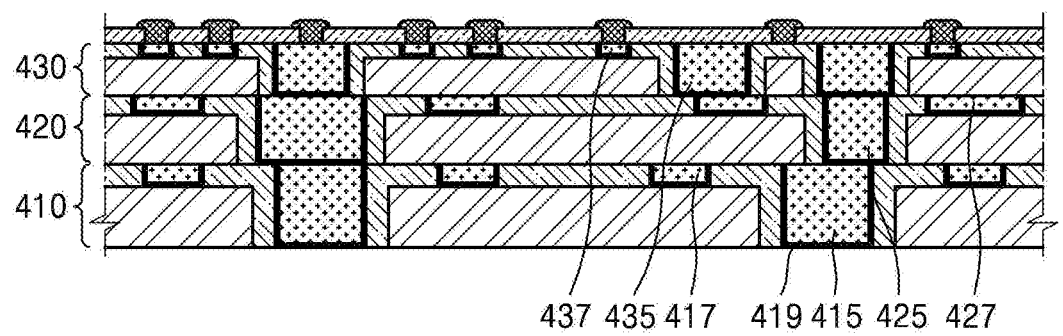
FIG. 5 is a diagram showing a portion of a base layer 400 in order to illustrate a detailed circuit configuration of a first conductive line of FIGS. 4A through 4C, according to an exemplary embodiment.

FIG. 5 is a diagram showing a portion of a base layer 400 in order to illustrate a detailed circuit configuration of the first conductive line CL1 of FIGS. 4A through 4C, according to an exemplary embodiment.

Referring to FIG. 5, the base layer 400 may include unit redistribution layers 410, 420, and 430. The unit redistribution layers 410, 420, and 430 may include conductor redistributions 417, 427, and 437 and conductor via plugs 415, 425, and 435, respectively. Conductor via plugs 415, 425, 435 may be, for example, conductive plugs formed of a conductive material such as a metal. The wiring patterns described above may also be formed of a conductive material, for example, a metal, and each may be formed horizontally within a die. According to an exemplary embodiment, the first conductive lines CL1 may be embodied as a structure in which the conductor redistributions 417, 427, and 437 are electrically connected to the conductor via plugs 415, 425, and 435. However, it is merely an exemplary embodiment, and conductive lines included in the second input/output circuits of FIGS. 4A through 4C may be fabricated via a redistribution layer operation like the first conductive lines CL1.

Figure 6:
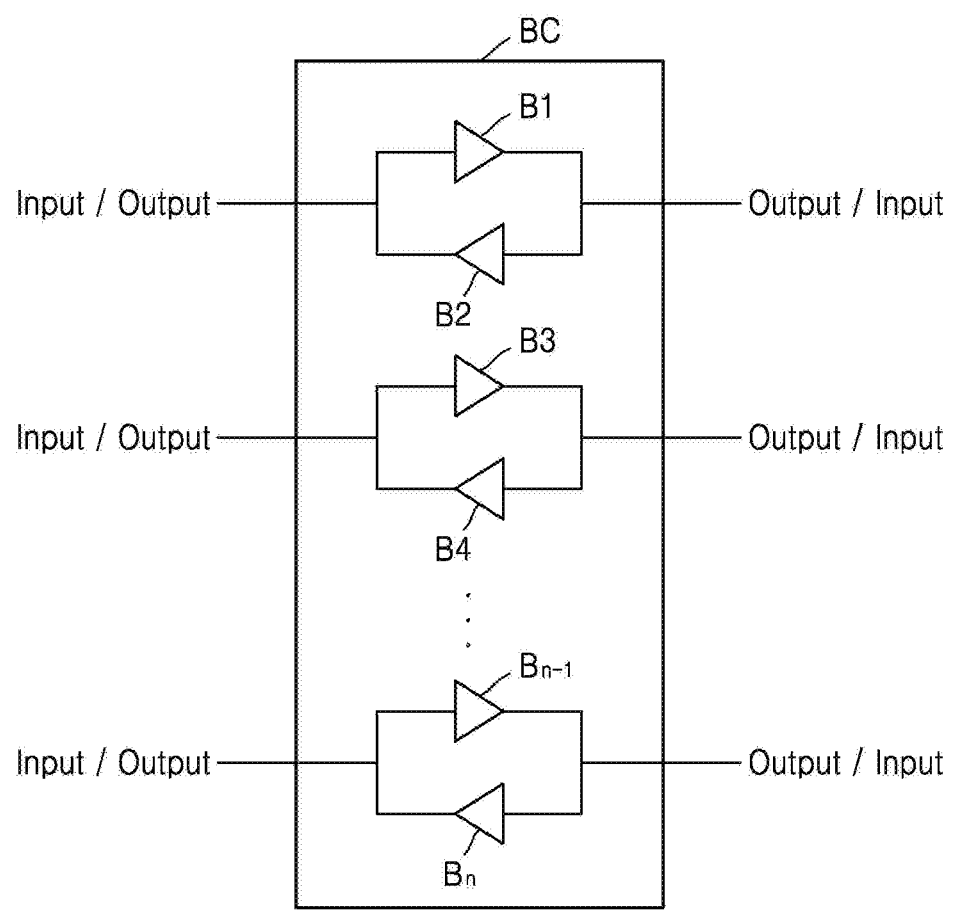
FIG. 6 is a schematic diagram of a buffer circuit according to an exemplary embodiment.

FIG. 6 is a schematic diagram of a buffer circuit BC according to an exemplary embodiment.

Referring to FIG. 6, the buffer circuit BC may include a plurality of buffers B1 through Bn. The buffers B1 through Bn may buffer input signals and output the buffered input signals as output signals. For example, according to an exemplary embodiment, the buffer circuit BC may buffer received signals and output the buffered signals, thereby compensating signal integrity of the received signals. Furthermore, although not shown, each of the buffers B1 through Bn may receive power via a certain conductive line, and each of the buffers B1 through Bn may perform the buffering operation by using the power.

Figure 7:
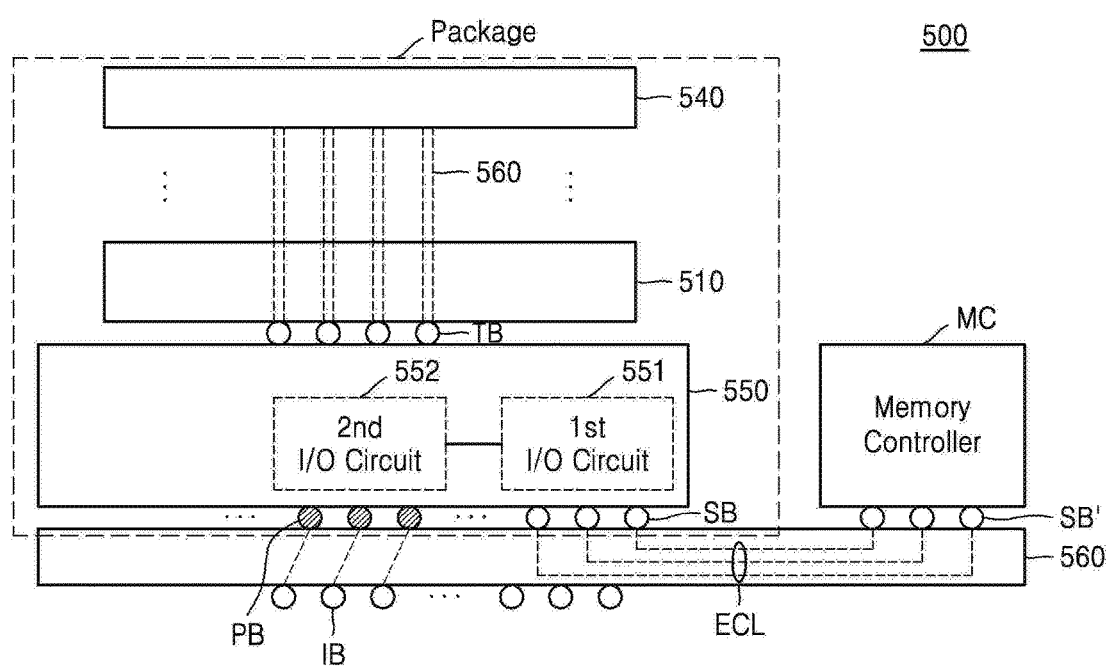
FIG. 7 is a diagram for describing a semiconductor memory module according to an exemplary embodiment.

FIG. 7 is a diagram for describing a semiconductor memory module 500 according to an exemplary embodiment.

Referring to FIG. 7, the semiconductor memory module 500 may include one or more semiconductor memory packages and an interposer 560. According to an exemplary embodiment, the semiconductor memory module 500 may include a semiconductor memory package attached to a surface of the interposer 560. Furthermore, a memory controller MC may be attached to a surface of the interposer 560. The semiconductor memory package may include a plurality of memory layers 510 through 540 and a base layer 550 that performs an interface operation regarding signals, where each of the memory layers 510 through 540 includes a plurality of memory cores. According to an exemplary embodiment, the memory layers 510 through 540 may be stacked on the base layer 550, where the base layer 550 may be electrically connected to the plurality of memory layers 510 through 540 via a TSV 560.

Compared to a plurality of power bumps PB, a plurality of signal bumps SB may be disposed in a first area of the base layer 550 closer to the memory controller MC, whereas the plurality of power bumps PB may be disposed in a second area of the base layer 550, where TSV bumps TB that contact the TSV 560 are disposed in the second area of the base layer 550. The base layer 550 may include a first input/output circuit 551 included in the first area and a second input/output circuit 552 included in the second area. A distance between the first input/output circuit 551 and the memory controller MC in a first direction is smaller than a distance between the second input/output circuit 552 and the memory controller MC in the first direction.

A plurality of signal bumps SB' may be disposed between the memory controller MC and the interposer 560, where the signal bumps SB' may be electrically connected to the signal bumps SB disposed on the base layer 550 via external conductive lines ECL. The interposer 560 may include a plurality of conductive lines including the external conductive lines ECL. The first input/output circuit 551 may transmit signals received from the memory controller MC to the second input/output circuit 552 or transmit signals received from the second input/output circuit 552 to the memory controller MC.

The second input/output circuit 552 may include a buffer circuit (not shown), may compensate signal integrity of signals received from the first input/output circuit 551, and transmit signal integrity-compensated signals to the memory layers 510 through 540. Furthermore, the second input/output circuit 552 may compensate signal integrity of signals received from the memory layers 510 through 540 and transmit signal integrity-compensated signals to the first input/output circuit 551. Furthermore, the buffer circuits may perform buffering operations for compensating signal integrity of the signals by using power received via power bumps PB. A plurality of bumps IB may be disposed on a surface of the interposer 560, where the interposer 560 may be electrically connected to a semiconductor substrate via the plurality of bumps IB.

Figure 8A:
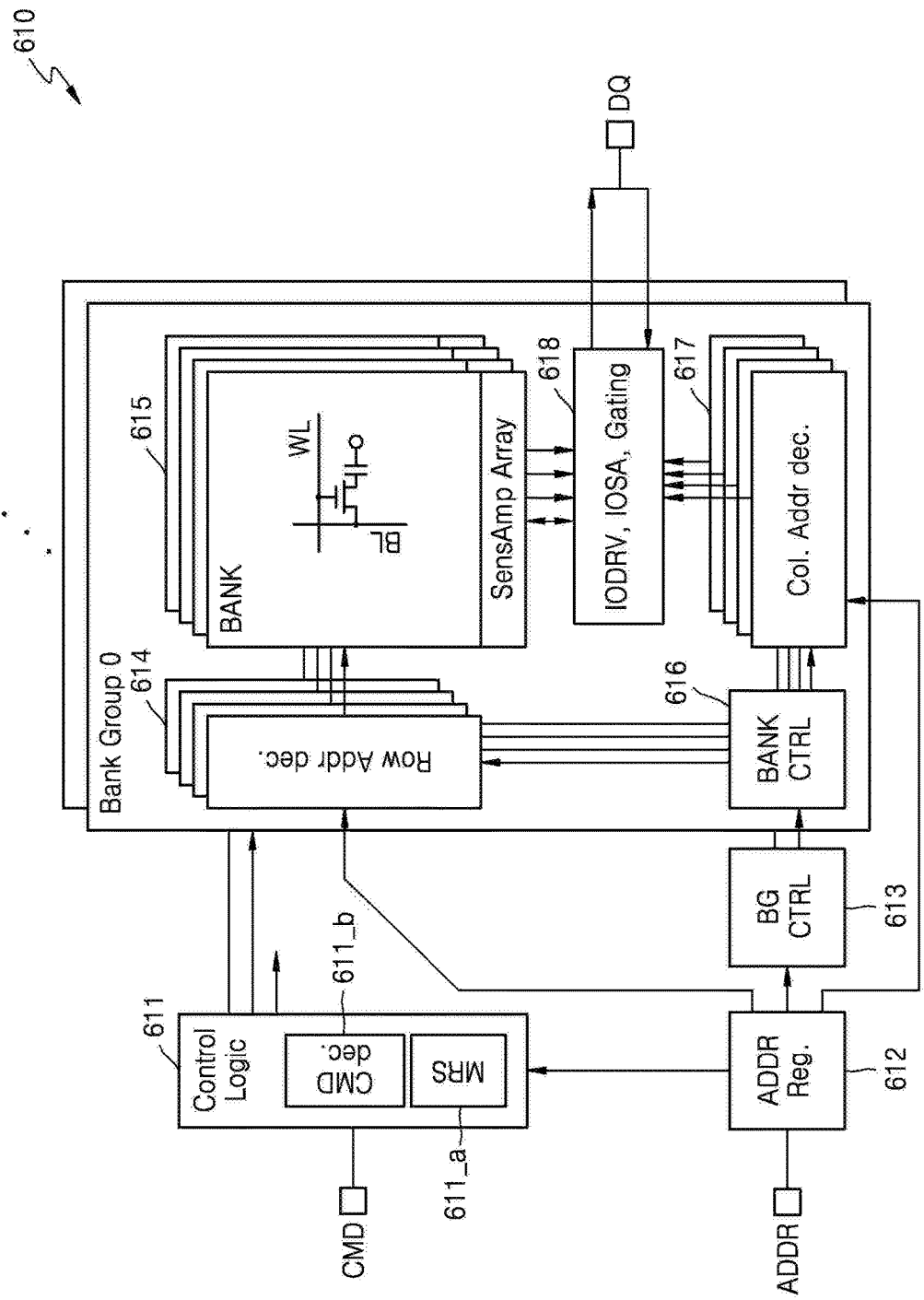
FIG. 8A is a diagram showing the structure of a memory layer according to another exemplary embodiment.
Figure 8B:
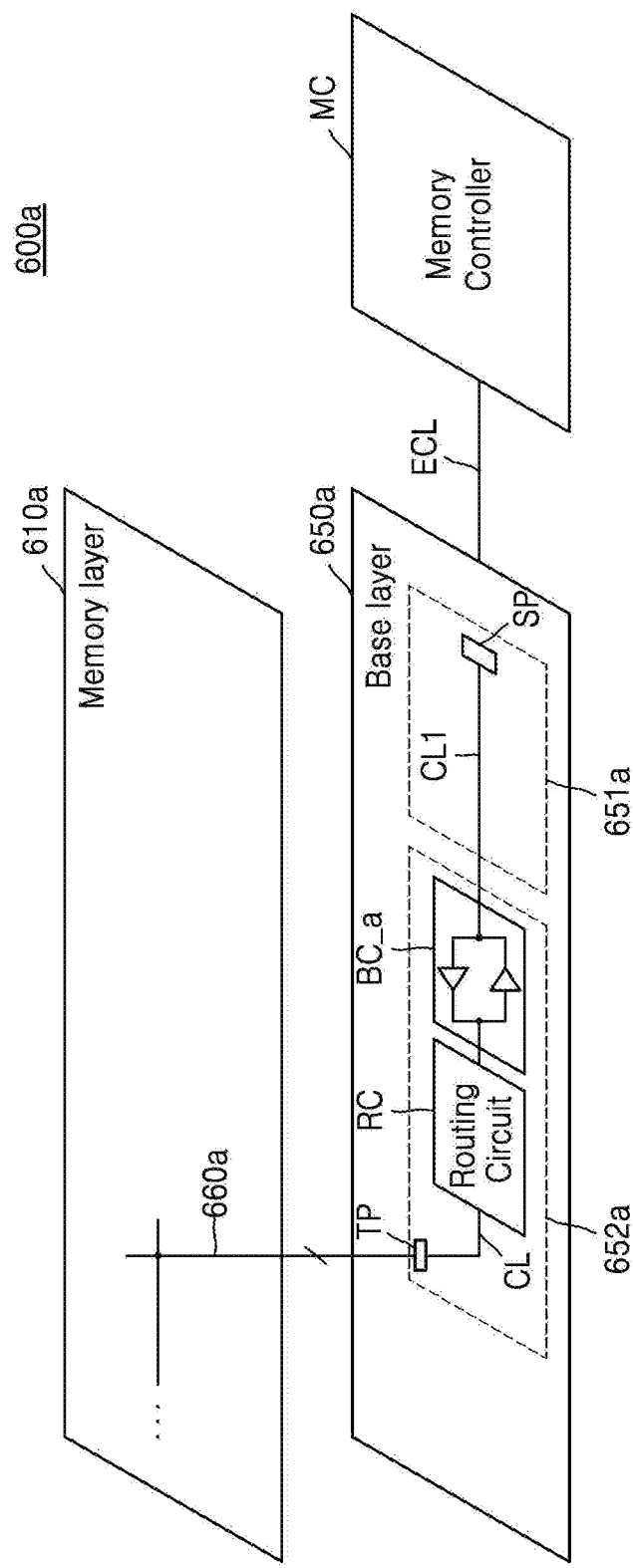
FIGS. 8B and 8C are diagrams showing structures in which the memory layer and a base layer of FIG. 8A are connected to each other via a TSV.
Figure 8C:
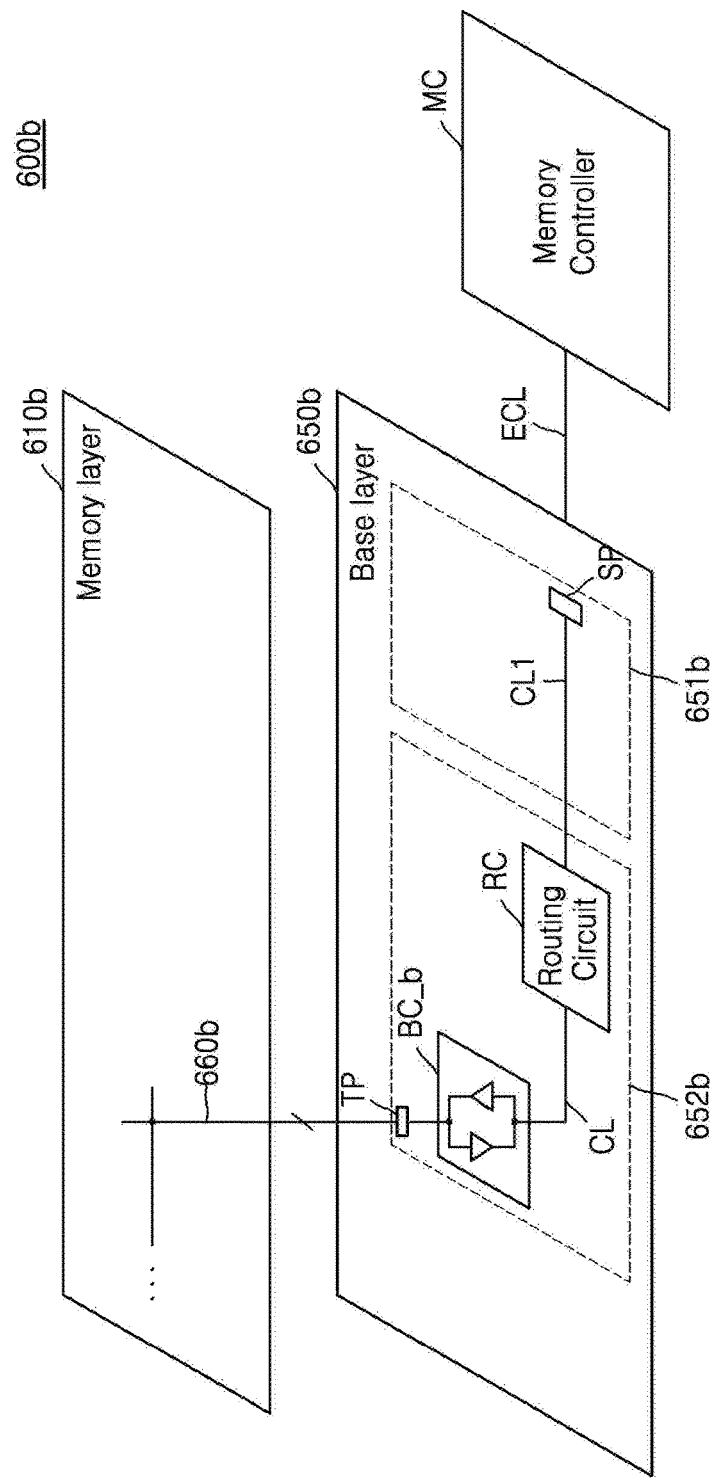

FIG. 8A is a diagram showing the structure of a memory layer 610 according to another exemplary embodiment, and FIGS. 8B and 8C are diagrams showing structures in which the memory layer 610 and a base layer 650 of FIG. 8A are connected to each other via a TSV 660.

Referring to FIG. 8A, the memory layer 610 may include at least one bank group Bank Group 0 including a plurality of memory banks BANK. The memory layer 610 may include memory banks 615 related to operations of a bank group, a row address decoder 614, a column address decoder 617, a bank controller 616, and an input/output driver 618. Furthermore, the memory layer 610 may include a control logic 611 that includes a mode register set (MRS) 611_a and a command register 611_b, an address register 612 that temporarily stores an address, and a bank group controller 613 for controlling a bank group.

Referring to FIG. 8B, a base layer 650a according to an exemplary embodiment may include a first input/output circuit 651a and a second input/output circuit 652a. The first input/output circuit 651a may include a signal pad SP that is electrically connected to an external conductive line ECL interconnecting a memory controller MC and the base layer 650a and a certain conductive lines CL1. The second input/output circuit 652a may include a TSV pad TP electrically connected to a TSV 660a, a routing circuit RC, a certain conductive line CL, and a buffer circuit BC_a. According to an exemplary embodiment, compared to the routing circuit RC, the buffer circuit BC_a may be disposed at a location closer to the first input/output circuit 651a or the memory controller. The buffer circuit BC_a may perform a buffering operation regarding signals received from the first input/output circuit 651a or may perform a buffering operation regarding signals that are received from the memory layer 610a and appropriately routed. According to an exemplary embodiment, the first input/output circuit 651a may transmit a data signal received from the memory controller MC to the second input/output circuit 652a via the first conductive line CL1. The buffer circuit BC_a of the base layer 650a may buffer the data signal and transmit the buffered data signal to the routing circuit RC. The base layer 650a may transmit the data signal routed by the routing circuit RC to the memory layer 610a via the TSV 660a.

Referring to FIG. 8C, a buffer circuit BC_b included in a base layer 650b may be disposed at a location different from that of the buffer circuit BC_a of FIG. 8B. For example, compared to the routing circuit RC, the buffer circuit BC_b according to an exemplary embodiment may be disposed at a location closer to a TSV 660b. That is, compared to the routing circuit RC, the buffer circuit BC_a may be disposed at a location further away from the first input/output circuit 651a or the memory controller MC. According to an exemplary embodiment, a first input/output circuit 651b may transmit a data signal received from a memory controller MC to a second input/output circuit 652b via the first conductive line CL1. A routing circuit RC of the second input/output circuit 652b may perform a routing operation regarding the data signal in order to transmit the received data signal to the memory layer 610b, which is a target to transmit the data signal to, via the TSV 660b. The buffer circuit BC_b of the second input/output circuit 652b may buffer the routed data signal and transmit the buffered data signal to the base layer 650b via the TSV 660b. However, it is merely an example. The buffer circuit BC_b of the second input/output circuit 652b may be disposed at one of various other locations, where the second input/output circuit 652b may further include a plurality of buffer circuits.

Figure 9A:
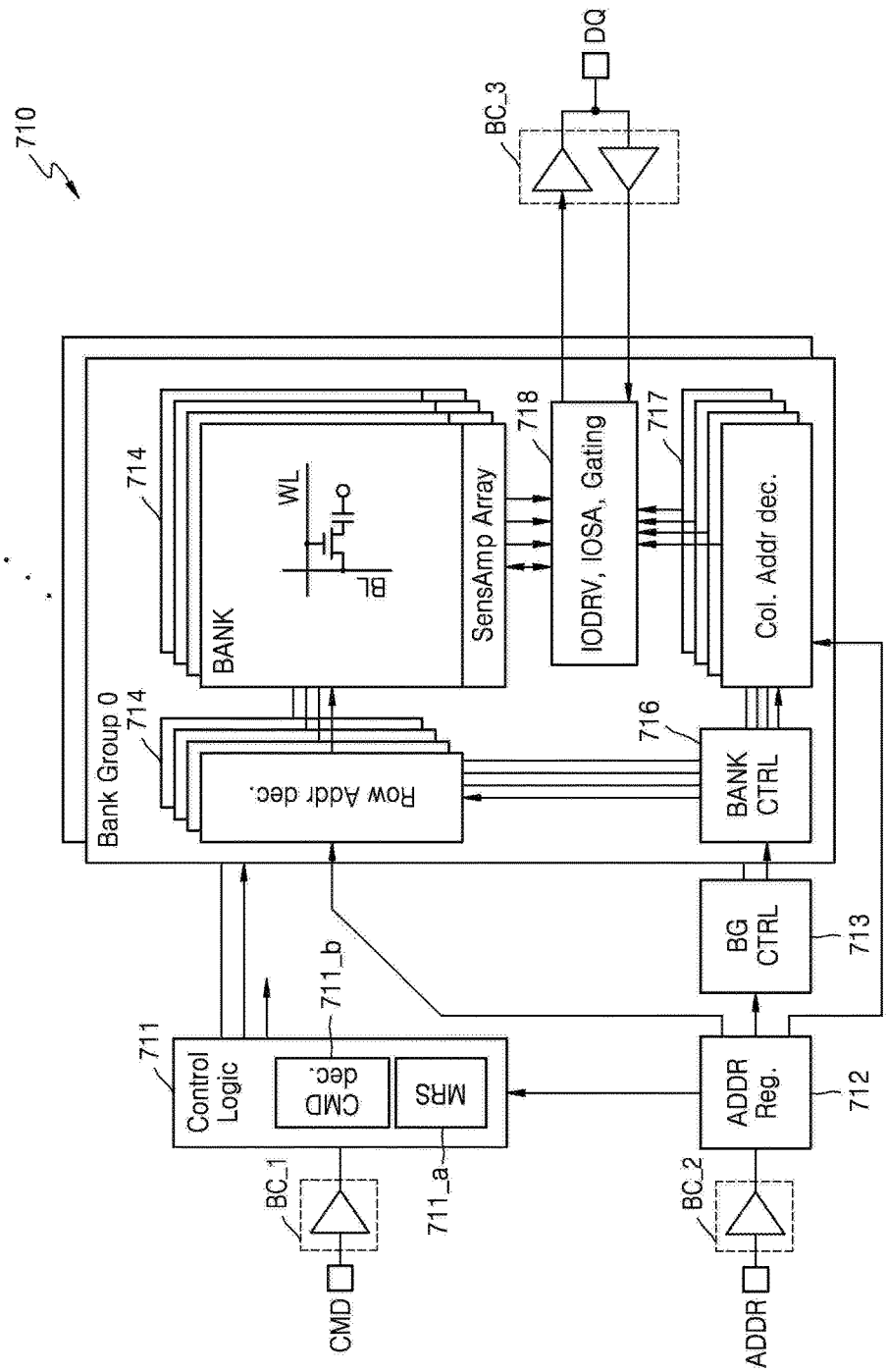
FIG. 9A is a diagram showing the structure of a memory layer according to an exemplary embodiment.
Figure 9B:
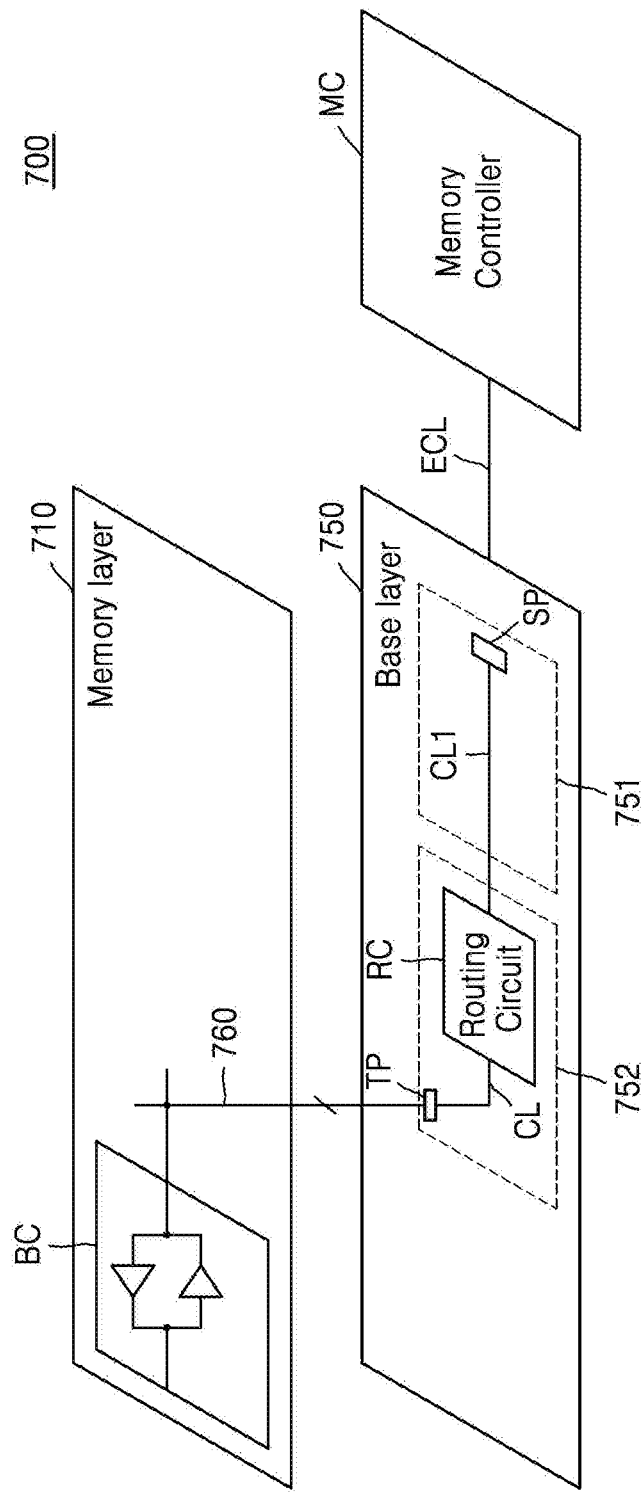
FIG. 9B is a diagram showing a structure in which the memory layer and a base layer of FIG. 9A are connected to each other via a TSV.

FIG. 9A is a diagram showing the structure of a memory layer 710 according to an exemplary embodiment, and FIG. 9B is a diagram showing a structure in which the memory layer 710 and a base layer 750 of FIG. 9A are connected to each other via a TSV 760. Furthermore, FIG. 9C is a diagram for describing a buffer circuit BC' of the memory layer 710.

Referring to FIG. 9A, compared to the memory layer 610 shown in FIG. 8A, the memory layer 710 according to an exemplary embodiment may further include buffer circuits BC_1, BC_2, and BC_3. According to an exemplary embodiment, the first buffer circuit BC_1 may buffer a command signal CMD received from a base layer via a TSV and provide the buffered command signal CMD to a control logic 711. Furthermore, the second buffer circuit BC_2 may buffer an address signal ADDR received from the base layer via the TSV and provide the buffered address signal ADDR to an address register 712. Furthermore, the third buffer circuit BC_3 may buffer a data signal DQ received from the base layer via the TSV and provide the buffered data signal DQ to an input/output driver 718 or may buffer a data signal DQ received from the input/output driver 718 and provide the buffered data signal DQ to the base layer via the TSV.

Referring to FIG. 9B, as described above with reference to FIG. 9A, the memory layer 710 may include a buffer circuit BC, and thus the base layer 750 may not include a separate buffer circuit. According to an exemplary embodiment, the base layer 750 may include a first input/output circuit 751 and a second input/output circuit 752. The first input/output circuit 751 may include a signal pad SP that is electrically connected to an external conductive line ECL interconnecting a memory controller MC and the base layer 650a and a certain conductive lines CL1. The second input/output circuit 752 may include a TSV pad TP electrically connected to a TSV 760, a routing circuit RC, and a certain conductive line CL. According to an exemplary embodiment, the base layer 750 may transmit signals received from a memory controller MC to the memory layer 710 and transmit signals received from the memory layer 710 to the memory controller MC, via the first input/output circuit 751 and the second input/output circuit 752.

Figure 9C:
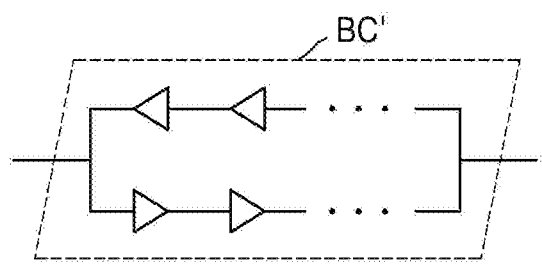
FIG. 9C is a diagram for describing a buffer circuit of the memory layer.

Referring to FIGS. 9B and 9C, a buffer circuit BC' included in the memory layer 710 may include a plurality of buffers. For example, since the base layer 750 of FIG. 9B does not include a separate buffer circuit, the buffer circuit BC' may be embodied as a serial connection of a plurality of buffers, where the memory layer 710 may further include a separate equalizer for compensating signal integrity of signals input to and output from the memory layer 710.

Accordingly, signals output by the memory layer 710 may be precisely transmitted to a memory controller via the base layer 750 or signals output by the memory controller may be precisely transmitted to the memory layer 710 via the base layer 750.

Figure 10:
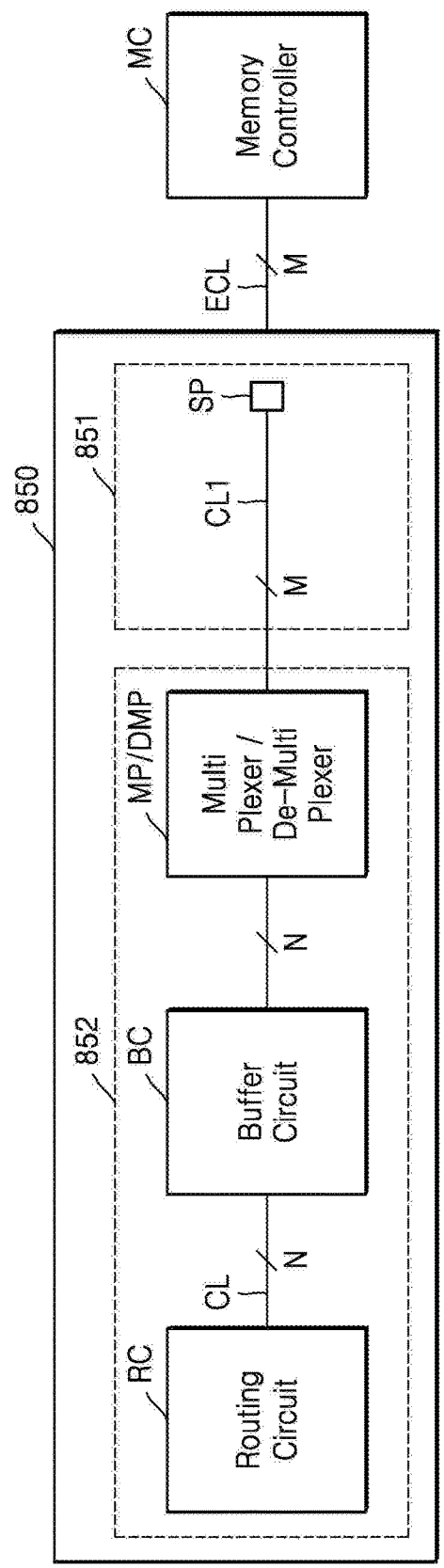
FIG. 10 is a block diagram showing a base layer according to an exemplary embodiment.

FIG. 10 is a block diagram showing a base layer 850 according to an exemplary embodiment.

Referring to FIG. 10, the base layer 850 may include a first input/output circuit 851 and a second input/output circuit 852. The base layer 850 may be electrically connected to a memory controller MC via an external conductive line ECL. The first input/output circuit 851 may include a signal pad SP electrically connected to the external conductive line ECL and M (M is a natural number equal to or greater than 1) conductive lines CL1. The second input/output circuit 852 may include a routing circuit RC, a buffer circuit BC, N (N is a natural number equal to or greater than 1) conductive lines CL, and multiplexer/de-multiplexer MP/DMP. According to an exemplary embodiment, the number M of the conductive lines CL1 of the first input/output circuit 851 may be different from the number N of the conductive lines CL of the second input/output circuit 852.

For example, it will be assumed below that the number M of the conductive lines CL1 of the first input/output circuit 851 is smaller than the number N of the conductive lines CL of the second input/output circuit 852. The second input/output circuit 852 may receive data signals from memory layers stacked on the base layer 850 via a TSV. Next, the multiplexer MP multiplexes signals routed by the routing circuit RC and buffered by the buffer circuit BC and transmits the multiplexed signals to the first input/output circuit 851, where the first input/output circuit 851 may provide the multiplexed signals to the memory controller MC via the external conductive line ECL. Furthermore, the first input/output circuit 851 may receive at least one of a command signal, an address signal, and a data signal from the memory controller MC. Next, the first input/output circuit 851 transmits the signal to the second input/output circuit 852. The de-multiplexer DMP may de-multiplex the signal and transmit the de-multiplexed signal to the buffer circuit BC. The de-multiplexed signal may be buffered by the buffer circuit BC, routed by the routing circuit RC, and transmitted to the memory layers via a TSV.

The multiplexer/de-multiplexer MP/DMP may receive power for performing a multiplexing operation or a de-multiplexing operation from outside of the memory package that includes the base layer 850. For example, like the buffer circuit BC described above with reference to FIG. 4A, the multiplexer/de-multiplexer MP/DMP may receive power via power bumps disposed in an area including the second input/output circuit 852 and conductive lines electrically connected to the power bumps.

Figure 11A:
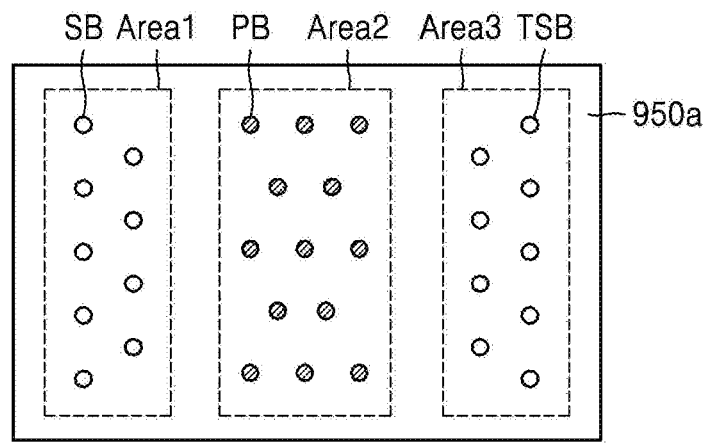
FIGS. 11A and 11B are diagrams for describing bumps formed on surfaces of base layers according to exemplary embodiments.
Figure 11B:
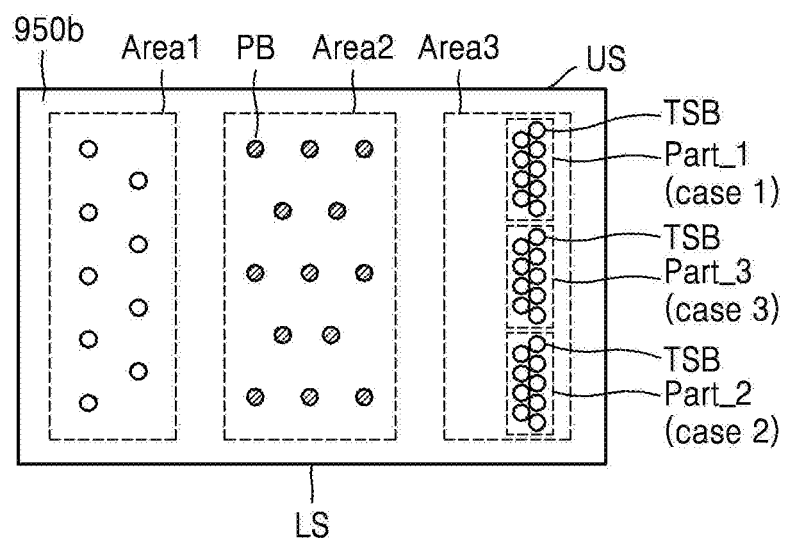
Figure 11C:
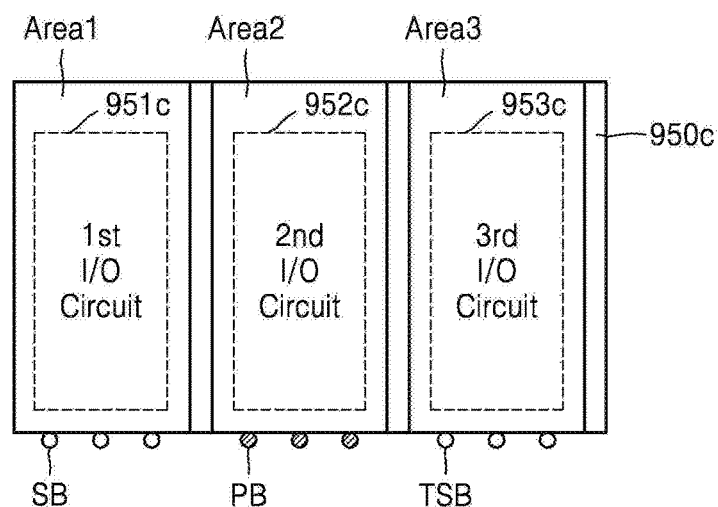
FIG. 11C is a diagram for describing an input/output circuit electrically connected to the bumps.

FIGS. 11A and 11B are diagrams for describing bumps formed on surfaces of base layers 950a and 950b according to embodiments, and FIG. 11C is a diagram for describing an input/output circuit electrically connected to the bumps.

Referring to FIG. 11A, the base layer 950a according to an exemplary embodiment may include a first area Area1, a second area Area2, and a third area Area3. The second area Area2 may be disposed between the first area Area1 and the third area Area3, and compared to the third area Area3, the first area Area1 may be disposed at a location closer to an external processor or a memory controller. In some embodiments, compared to the first area Area1, the third area is disposed at a location closer to an external tester. The first area Area1 includes signal bumps SB for exchanging signals with the external processor or the memory controller, the second area Area2 contacts a TSV penetrating through memory layers stacked on the base layer 950a and includes power bumps PB for receiving power from an external power supply or a PMIC, and the third area Area3 includes test signal bumps TSB for receiving test signals from the external tester. The third area Area3 may correspond to an edge area different from the first area Area1 of the base layer 950a. The number of the test signal bumps TSB disposed in the third area Area3 may vary according to the number of external conductive lines for electrically connecting the external tester to the base layer 950a. Since the first area Area1 and the second area Area2 are described above in detail, detailed description thereof will be omitted below.

Referring to FIG. 11B, unlike the test signal bumps TSB disposed in the third area Area3 of the base layer 950a of FIG. 11A, test signal bumps TSB may be densely disposed in a particular portion of the third area Area3. Furthermore, according to a location of the external tester, the test signal bumps TSB may be densely disposed in a particular portion of the third area Area3. For example, in a first case Case1, the test signal bumps TSB may be disposed in a first part Part_1 closer to the upper side US of the base layer 950b at a higher density compared to FIG. 11A. In a second case Case2, the test signal bumps TSB may be disposed in a second portion Part_2 close to the lower side LS of the base layer 950b at a higher density compared to FIG. 11A. Furthermore, in a third case Case3, the test signal bumps TSB may be disposed in a third portion Part_3, which corresponds to a portion of the base layer 950b between the upper side US and the lower side LS, at a higher density compared to FIG. 11A.

Referring to FIG. 11C, a base layer 950c may include a first area Area1, a second area Area2, and a third area Area3. The second area Area2 may be disposed between the first area Area1 and the third area Area3, and compared to the third area Area3, the first area Area1 may be disposed at a location closer to an external processor or a memory controller. In some embodiments, compared to the first area Area1, the third area is disposed at a location closer to an external tester. The second area Area2 contacts TSVs disposed at memory layers. The first area Area1 may include a first input/output circuit 951c, the second area Area2 may include a second input/output circuit 952c, and the third area Area3 may include a third input/output circuit 953c. The first input/output circuit 951c may be disposed to be electrically connected to signal bumps SB, the second input/output circuit 952c may be disposed to be electrically connected to power bumps PB, and the third input/output circuit 953c may be disposed to be electrically connected to the test signal bumps TSB.

According to an exemplary embodiment, the first input/output circuit 951c may transmit and receive signals via the signal bumps SB. For example, the first input/output circuit 951c may transmit signals received from the memory controller to the second input/output circuit 952c or transmit signals received from the second input/output circuit 952c to the memory controller. Furthermore, the third input/output circuit 953c may transmit test signals received from the external tester to the second input/output circuit 952c or transmit test result signals received from the second input/output circuit 952c to the external tester. The second input/output circuit 952c may receive power via the power bumps PB, and the second input/output circuit 952c may electrically connect signals received from the first input/output circuit 951c, test signals received from the third input/output circuit 953c, and power received from outside to the TSVs, which are signal transmission targets, via signal routing. Furthermore, the second input/output circuit 952c may include a buffer circuit, thereby compensating signal integrity of signals received from the first input/output circuit 951c, test signals received from the third input/output circuit 953c, and test result signals received from memory layers.

The various areas described herein as being closer to a controller or processor than other areas may be, as shown in the figures, closer horizontally (e.g., in a plan view) to the controller or processor, but the disclosure is not limited to these embodiments.

Figure 12:
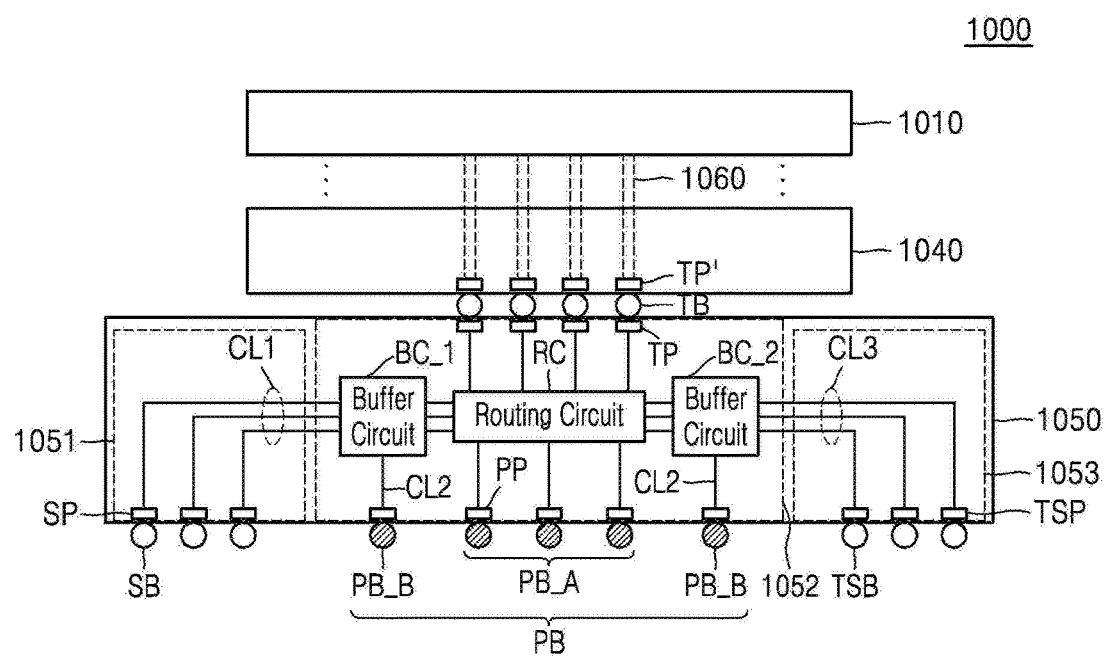
FIG. 12 is a diagram for describing a semiconductor memory package according to an exemplary embodiment.

FIG. 12 is a diagram for describing a semiconductor memory package 1000 according to an exemplary embodiment.

Referring to FIG. 12, the semiconductor memory package 1000 may include a plurality of memory layers 1010 through 1040, a base layer 1050, a TSV 1060, and a plurality of bumps SB, PB, and TB. The base layer 1050 may include a first input/output circuit 1051 and a second input/output circuit 1052 for interfacing with a memory controller and/or the memory layers 1010 through 1040. Furthermore, the base layer 1050 may further include a third input/output circuit 1053 for testing the semiconductor memory package 1000.

As described above, the plurality of memory layers 1010 through 1040 may be stacked on the base layer 1050, where the base layer 1050 may be connected to the plurality of memory layers 1010 through 1040 via the TSV 1060. A plurality of signal bumps SB may be disposed in a first area of the base layer 1050, a plurality of power bumps PB may be disposed in a second area of the base layer 1050, and a plurality of test signal bumps TSB may be disposed in a third area Area3 of the base layer 1050. Particularly, the test signal bumps TSB may be electrically connected to the external tester, such that the external tester that controls a testing operation and the semiconductor memory package 1000 may communicate with each other.

The third input/output circuit 1053 may include a plurality of test signal pads TSP and a plurality of third conductive lines CL3. According to an exemplary embodiment, the third conductive lines CL3 may be disposed via a redistribution layer operation. The third conductive lines CL3 may be conductive units for transmitting test signals received by the test signal pads TSP to the second input/output circuit 1052 or transmitting test result signals received from the second input/output circuit 1052 to the test signal bumps TSB. For example, the third input/output circuit 1053 may directly transmit test signals received from the external tester to the second input/output circuit 1052 via the third conductive lines CL3 without performing a certain signal processing operation or directly transmit signals received from the second input/output circuit 1052 to the test signal bumps TSB via the third conductive lines CL3 without performing a certain signal processing operation.

The second input/output circuit 1052 may include certain conductive lines, a plurality of power pads PP, a buffer circuit BC, and a routing circuit RC. The power pads PP may be conductive units that directly contact the power bumps PB and are electrically connected thereto. Furthermore, the power pads PP may refer to some line areas of the first conductive lines CL1 that contact the power bumps PB.

According to an exemplary embodiment, a second buffer circuit BC_2 may compensate signal integrity of test signals received from the third input/output circuit 1053 and/or test result signal integrity of signals received from the memory layers 1010 through 1040. For example, the second buffer circuit BC_2 may be electrically connected to the third conductive lines CL3 of the third input/output circuit 1053 and may compensate signal integrity of test signals received via the third conductive lines CL3. The second buffer circuit BC_2 may transmit the signal integrity compensated test signals to the routing circuit RC. Furthermore, the second buffer circuit BC_2 may receive test result signals that are received from the memory layers 1010 through 1040 and are routed by the routing circuit RC and compensate signal integrity of the test result signals. The second buffer circuit BC_2 may transmit the signal integrity compensated test result signals to the third input/output circuit 1053. Furthermore, the second buffer circuit BC_2 may receive power via a power pad PP and a second conductive line CL2. The second buffer circuit BC_2 may perform a buffering operation by using the power. However, although FIG. 11 shows a configuration that the second buffer circuit BC_2 directly receives power from the power bump PB_B via the second conductive line CL2, the inventive concept is not limited thereto, and various other circuit configurations may be employed. For example, the second buffer circuit BC_2 may receive power via the routing circuit RC. Since the other configurations are described above in detail with reference to FIG. 4A, detailed description thereof will be omitted below.

Figure 13:
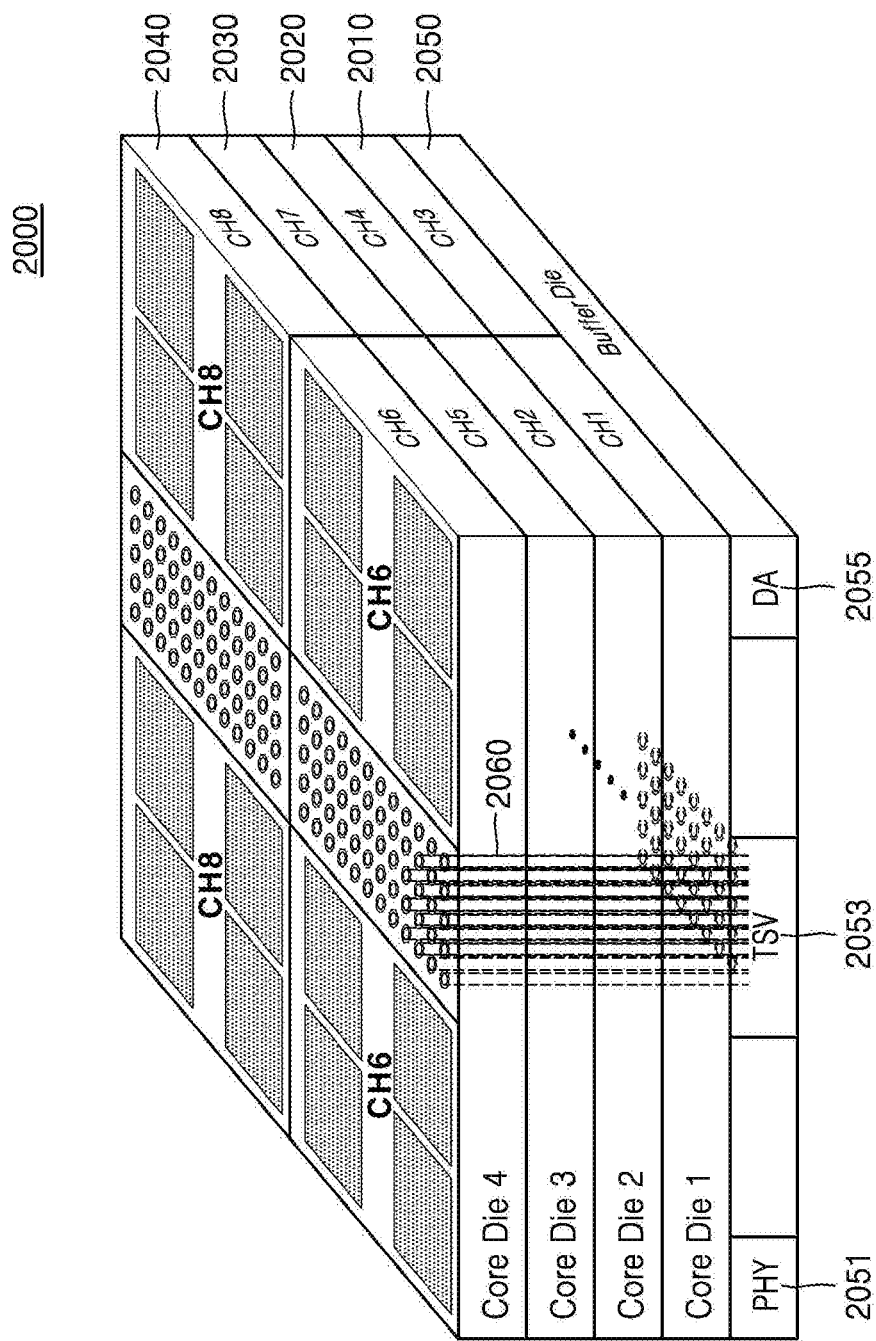
FIG. 13 is a block diagram showing a memory device having a stacked structure, according to an exemplary embodiment.

FIG. 13 is a block diagram showing a memory device having a stacked structure, according to an exemplary embodiment.

FIG. 13 exemplifies a HBM type memory device that includes a plurality of channels having independent interfaces for an increased bandwidth.

Referring to FIG. 13, a memory device 2000 may include a plurality of layers. For example, the memory device 2000 may include a buffer die 2050 and one or more core dies 2010 through 2040 stacked thereon. The buffer die 2050 may correspond to a base layer as shown in FIG. 1, whereas the core dies 2010 through 2040 may correspond to memory layers as shown in FIG. 1. Although FIG. 13 shows an example in which the first through fourth core dies 2010 through 2040 are included, the number of core dies may vary.

Each of the core dies 2010 through 2040 may include one or more channels. FIG. 13 shows an example in which, as each of the core dies 2010 through 2040 includes two channels, the memory device 2000 includes eight channels CH1 through CH8. For example, the first core die 2010 may include first and third channels CH1 and CH3, the second core die 2020 may include second and fourth channels CH2 and CH4, the third core die 2030 may include fifth and seventh channels CH5 and CH7, and the fourth core die 2040 may include sixth and eighth channels CH6 and CH8.

Furthermore, the memory device 2000 may include a plurality of TSVs 2060 that penetrate through the core dies 2010 through 2040. The TSVs 2060 may be disposed in correspondence to the plurality of channels CH1 through CH8. When each channel has a 128-bit bandwidth, the TSVs 2060 may have a configuration for inputting and outputting 1024-bit data.

The buffer die 2050 may communicate with a memory controller, receive a command, an address, and data from the memory controller, and provide the received command, address, and data to the core dies 2010 through 2040. The buffer die 2050 may include a physical area (PHY) 2051, a TSV area (TSV) 2053, and a direct access area (DA) 2055. The physical area 2051 may correspond to a first area as shown in FIG. 1, the TSV area 2053 may correspond to a second area as shown in FIG. 1, and the direct access area 2055 may correspond to a third area as shown in FIG. 1.

The physical area 2051 may be an area close to the memory controller and may be an edge area at a first side of the buffer die 2050. The TSV area 2053 may be an area contacting the TSVs 2060 penetrating through the core dies 2010 through 2040 and may be a center area of the buffer die 2050. Furthermore, the direct access area 2055 may be an area close to (e.g., adjacent to) an external tester and may be an edge area at a second side of the buffer die 2050. The physical area 2051 may include a first input/output circuit as shown in FIG. 1, where the first input/output circuit may transmit signals received from the memory controller to the TSV area 2053. The direct access area 2055 may include a third input/output circuit as shown in FIG. 11C, where the third input/output circuit may transmit test signals received from the external tester to the TSV area 2053. The TSV area 2053 may include a second input/output circuit as shown in FIG. 1, where the second input/output circuit may perform a certain signal processing operation (e.g., a buffering operation) with regard to signal received from the first input/output circuit or test signals received from the third input/output circuit and transmit the signals or the test signals to the core dies 2010 through 2040 via the TSVs 2060.

Signal bumps for exchanging signals with the memory controller may be disposed in the physical area 2051, whereas power bumps for receiving power for performing the signal processing operation may be disposed in the TSV area 2053. Furthermore, test signal bumps for exchanging test signals with the external tester may be disposed in the direct access area 2055. Accordingly, bumps may be formed in the respective areas 2051, 2053, and 2055 according to desired purposes. However, it is merely an example, and the buffer die 2050 may further include an area that includes a certain input/output circuit for interfacing with the memory controller or the external tester. However, the inventive concept is not limited thereto.

In some embodiments, one or more signal TSVs/bumps for receiving the signal from the external memory controller 30 (as shown in FIG. 1) may be disposed only in the physical area 2051 not in the TSV area 2053, and one or more power TSVs/bumps for receiving power for performing the signal processing operation from outside of the memory device may be disposed only in the TSV area 2053 not in the physical area 2051. In some embodiments, multiple adjacent rows of signal TSVs/bumps may be disposed in the physical area 2051 and multiple adjacent rows of power TSVs/bumps may be disposed in the TSV area 2053, and all signal TSVs/bumps may be disposed only in the physical area 2051 and all power TSVs/bumps may be disposed only in the TSV area 2053.

In these embodiments, the arrangement of components of the different dies may still be the same in relation to each other, so that the dies have the same circuit layouts and structures for these components.

Figure 14:
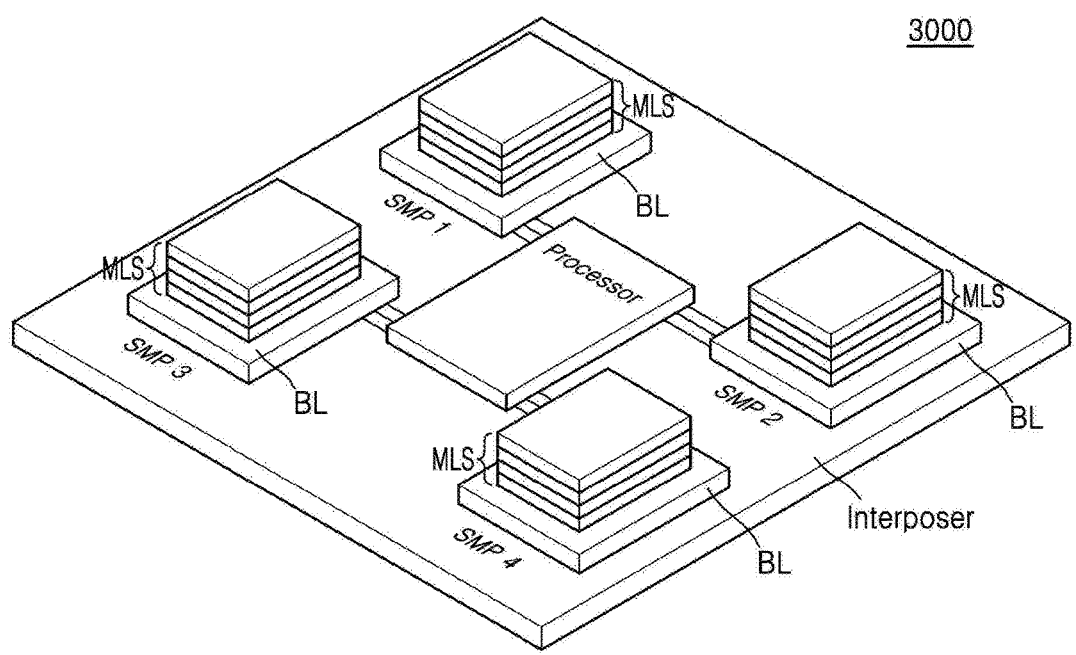
FIG. 14 is a diagram showing a semiconductor memory module including a plurality of semiconductor memory packages according to an exemplary embodiment.

FIG. 14 is a diagram showing a semiconductor memory module 3000 including a plurality of semiconductor memory packages according to an exemplary embodiment.

Referring to FIG. 14, the semiconductor memory module 3000 may include a plurality of semiconductor memory packages SMP1 through SMP4 and an interposer. Each of the semiconductor memory packages SMP1 through SMP4 may include a base layer BL and a plurality of memory layers MLs stacked on a surface of the base layer BL. Certain bumps are disposed in each of the semiconductor memory packages SMP1 through SMP4 and are arranged on a surface of the interposer, thereby being electrically connected to certain conductive devices included in the interposer. Furthermore, a processor for controlling operations of the semiconductor memory packages SMP1 through SMP4 may be disposed on a surface of the interposer. The processor may be electrically connected to the semiconductor memory packages SMP1 through SMP4 via the conductive devices included in the interposer.

According to an exemplary embodiment, signal bumps for exchanging signals with the processor may be disposed in first areas of the base layers BL close to the processor, whereas power bumps for receiving power may be disposed in second areas of the base layers BL contacting TSVs penetrating through the memory layers MLs. Furthermore, the base layer BL may include a first input/output circuit and a second input/output circuit as shown in FIG. 1 and perform signal interface operations between the processor and the semiconductor memory packages SMP1 through SMP4.

FIG. 15 is a block diagram showing an example of applying a memory device according to an exemplary embodiment to a mobile system.

Referring to FIG. 15, a mobile system 4000 may include an application processor 4010, a communicator 4020 (e.g., connectivity), a first memory device 4030, a second memory device 4040, a user interface 4050, and a power supply 4060 that are connected to one another via a bus 4002. The first memory device 4030 may be a volatile memory device, whereas the second memory device 4040 may be a non-volatile memory device. According to some embodiments, the mobile system 4000 may be an arbitrary mobile system, such as a mobile phone, a smart phone, a personal digital assistant (PDA), a portable multimedia player (PMP), a digital camera, a music player, a portable game console, and a navigation system.

The application processor 4010 may execute applications that provide an internet browser, a game, a moving picture, etc. According to some embodiments, the application processor 4010 may include a single process core or a plurality of process cores. For example, the application processor 4010 may include dual-cores, quad-cores, or hexa-cores. Furthermore, according to some embodiments, the application processor 4010 may further include a cache memory that is disposed inside or outside the application processor 4010.

The communicator 4020 may perform wireless communication or wire communication with an external device. For example, the communicator 4020 may perform Ethernet communication, near field communication (NFC), radio frequency identification (RFID) communication, mobile telecommunication, memory card communication, universal serial bus (USB) communication, etc. for example, the communicator 4020 may include a baseband chipset and support communication protocols including GSM, GRPS, WCDMA, and HSxPA.

The first memory device 4030, which is a volatile memory device, may store data to be processed by the application processor 4010 or may function as a working memory. The first memory device 4030 may correspond to a semiconductor memory package as stated above with reference to FIG. 1. The first memory device 4030 may include a base layer and a plurality of memory layers. A command signal, an address signal, and a data signal may be provided from the application processor 4010 to the memory layers via the base layer. Bumps may be disposed on a surface of the base layer according to purposes. For example, signal bumps may be disposed in a first area of the base layer close to the application processor 4010, whereas power bumps may be disposed in a second area of the base layer contacting TSVs penetrating through the memory layers. Therefore, the first memory device 4030 may efficiently communicate with the application processor 4010 as described above.

The second memory device 4040, which is a non-volatile memory device, may store a boot image for booting the mobile system 4000. For example, the second memory device 4040 may include an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or any other similar memory.

The user interface 4050 may include one or more input device, such as a keypad and a touch screen, and/or one or more output device, such as a speaker and a display device. The power supply 4060 may supply voltage for operating the mobile system 4000. Furthermore, according to some embodiments, the mobile system 4000 may further include a camera image processor (CIP) and may further include a storage device, such as a memory card, a solid state drive (SSD), a hard disk drive (HDD), and a CD-ROM.

While the inventive concept has been particularly shown and described with reference to embodiments thereof, it will be understood that various changes in form and details may be made therein without departing from the spirit and scope of the following claims.

What is claimed is:

1. An electronic device comprising:
a base layer that communicates with a memory controller;
at least one memory layer that is stacked on the base layer; and
at least one through silicon via that penetrates through the at least one memory layer,
wherein at least one signal bump for exchanging a signal with the memory controller is disposed in a first area of the base layer located to be adjacent to the memory controller, and wherein the first area corresponds to an edge area of the base layer, and at least one power bump for receiving power from outside of a semiconductor memory package, the power for performing a signal processing operation on the signal, wherein the power bump is disposed in a second area of the base layer and contacts the at least one through silicon via, wherein the second area corresponds to an area other than edge areas of the base layer, wherein all signal bumps are disposed only in the first area of the base layer located to be adjacent to the memory controller and all power bumps are disposed only in the second area of the base layer located to be further away from the memory controller compared to the signal bumps, wherein the first area comprises a first input/output circuit including a first signal pad connected to the signal bump and a first conductive line, and the second area comprises a second input/output circuit connected to the at least one through silicon via and including a power pad connected to the power bump, and wherein the first conductive line interconnects the second input/output circuit and the first signal pad to connect the at least one through silicon via and the signal bump through the second input/output circuit.

2. The electronic device of claim 1, wherein the signal processing operation comprises a buffering operation for compensating signal integrity of the signal.

3. The electronic device of claim 1, wherein the first conductive line transmits the signal between the second input/output circuit and the first signal pad.

4. The electronic device of claim 1, wherein the first conductive line is disposed via a redistribution layer operation.

5. The electronic device of claim 4, wherein the first area further comprises a circuit that performs functions different from that of the first input/output circuit and is disposed in a remaining portion of the first area other than the portion occupied by the first input/output circuit.

6. The electronic device of claim 1, wherein the second input/output circuit comprises a buffer circuit that is connected to the first input/output circuit and performs the signal processing operation.

7. The electronic device of claim 6, wherein the second input/output circuit comprises a second conductive line that interconnects the power pad and the buffer circuit and transmits the power from the power pad to the buffer circuit.

8. The electronic device of claim 1, wherein at least one test signal bump for exchanging a test signal with an external tester is formed in a third area of the base layer located to be adjacent to the external tester, wherein the third area corresponds to another edge area of the base layer such that the second area is disposed between the first area and the third area.

9. The electronic device of claim 1, further comprising:
an interposer; and
a memory controller attached to a surface of the interposer.

10. An electronic device comprising:
a base layer;
at least one memory layer that is stacked on the base layer; and
at least one through substrate via (TSV) that penetrates through the at least one memory layer,
wherein:
the base layer comprises a physical area adjacent to an external memory controller and a TSV area where the at least one TSV is disposed,
the physical area corresponds to an edge area of the base layer and the TSV area corresponds to an area other than edge areas of the base layer, the physical area comprises a first input/output circuit that transmits a signal received from the external memory controller to the TSV area, and
the TSV area comprises a second input/output circuit that performs a signal processing operation on the received signal and transmits the processed signal to the at least one memory layer,
wherein one or more signal TSVs/bumps for receiving the signal from the external memory controller are disposed only in the physical area not in the TSV area, and one or more power TSVs/bumps for receiving power for performing the signal processing operation from outside of a memory device are disposed only in the TSV area not in the physical area,
wherein the first input/output circuit includes a first signal pad connected to the signal TSV/bump and a first conductive line, and wherein the second input/output circuit is connected to the at least one TSV and includes a power pad connected to the power TSV/bump, and
wherein the first conductive line interconnects the second input/output circuit and the first signal pad to connect the at least one TSV and the signal TSV/bump through the second input/output circuit.

11. The electronic device of claim 10, wherein the second input/output circuit is configured to perform a signal processing operation on a signal received from the at least one memory layer and transmits the processed signal to the first input/output circuit included in the physical area, and
the first input/output circuit is configured to transmit the processed signal received from the second input/output circuit to the external memory controller.

12. The electronic device of claim 10, wherein the first signal pad is configured to receive the signal from the external memory controller, and
wherein the power pad is configured to receive power for performing the signal processing operation from outside of the memory device.

13. The electronic device of claim 12, wherein the second input/output circuit further comprises a buffer circuit that compensates signal integrity of a signal received from the first input/output circuit.

14. The electronic device of claim 10, wherein multiple adjacent rows of signal TSVs/bumps are disposed in the physical area and multiple adjacent rows of power TSVs/bumps are disposed in the TSV area, and wherein all signal TSVs/bumps are disposed only in the physical area and all power TSVs/bumps are disposed only in the TSV area.

15. The electronic device of claim 10, wherein the base layer comprises a direct access area that is positioned to be adjacent to an external tester and includes a third input/output circuit for transmitting a test signal received from the external tester to the TSV area, wherein the direct access area corresponds to another edge area of the base layer such that the TSV area is disposed between the physical area and the direct access area, and
the second input/output circuit performs a signal processing operation on the received test signal and transmits the processed test signal to the at least one memory layer.

16. The electronic device of claim 10, further comprising:
an interposer; and
a memory controller attached to a surface of the interposer.

17. A memory module comprising:
an interposer;
a memory controller attached to a surface of the interposer; and
one or more semiconductor memory packages each comprising:
  a base layer that communicates with the memory controller;
  at least one memory layer that is stacked on the base layer; and
  at least one through silicon via that penetrates through the at least one memory layer,
wherein at least one signal bump for exchanging a signal other than power signal with the memory controller is disposed only in a first area of the base layer located to be adjacent to the memory controller, and wherein the first area corresponds to an edge area of the base layer, and
at least one power bump for receiving a power signal from outside of the semiconductor memory package for performing a signal processing operation on the signal other than the power signal is disposed only in a second area of the base layer contacting the at least one through silicon via, wherein the second area corresponds to an area other than edge areas of the base layer, and
wherein all signal bumps are disposed only in the first area of the base layer located to be adjacent to the memory controller and all power bumps are disposed only in the second area of the base layer located to be further away from the memory controller compared to the signal bumps,
wherein the first area comprises a first input/output circuit including a first signal pad connected to the signal bump and a first conductive line, and the second area comprises a second input/output circuit connected to the at least one through silicon via and including a power pad connected to the power bump, and
wherein the first conductive line interconnects the second input/output circuit and the first signal pad to connect the at least one through silicon via and the signal bump through the second input/output circuit.

18. The memory module of claim 17, wherein a distance from the first area to the memory controller in a first direction is smaller than a distance from the second area to the memory controller in the first direction.

19. The memory module of claim 17, wherein the first conductive line transmits the signal between the second input/output circuit and the first signal pad.

20. The memory module of claim 17, wherein at least one test signal bump for exchanging a test signal with an external tester is formed only in a third area of the base layer located to be adjacent to the external tester, wherein the third area corresponds to another edge area of the base layer such that the second area is disposed between the first area and the third area.

* * * * *